US007003744B2

(12) United States Patent
Weller et al.

(10) Patent No.: US 7,003,744 B2
(45) Date of Patent: Feb. 21, 2006

(54) GLOBAL EQUIVALENT CIRCUIT MODELING SYSTEM FOR SUBSTRATE MOUNTED CIRCUIT COMPONENTS INCORPORATING SUBSTRATE DEPENDENT CHARACTERISTICS

(75) Inventors: Thomas Weller, Lutz, FL (US); John Capwell, Tampa, FL (US)

(73) Assignee: University of South Florida, Tampa, FL (US)

( * ) Notice: Subject to any disclaimer, the term of this patent is extended or adjusted under 35 U.S.C. 154(b) by 179 days.

(21) Appl. No.: 10/249,565

(22) Filed: Apr. 18, 2003

(65) Prior Publication Data

US 2004/0128633 A1 Jul. 1, 2004

Related U.S. Application Data

(60) Provisional application No. 60/373,511, filed on Apr. 18, 2002.

(51) Int. Cl.
*G06F 17/50* (2006.01)

(52) U.S. Cl. .................................. 716/4; 716/5; 716/1

(58) Field of Classification Search .................... 716/4, 716/5, 1

See application file for complete search history.

(56) References Cited

U.S. PATENT DOCUMENTS 6,031,986 A * 2/2000 Milsom ....................... 703/14

OTHER PUBLICATIONS

Lakshminarayanan et al.,"A Substrate-Dependent CAD Model for Ceramic Multilayer Capacitors", Oct. 2000, IEEE Transaction on Microwave Theory and Techniques, vol. 48, iss. 10, pp. 1687-1693.*

Zhao et al.,"S Parameter-Based Experimental Modeling of High Q MCM Inductor with Expontential Gradient Learning Algorithm",Feb. 1997, IEEE Multi-Chip Module Conference, paper, pp. 108-113.*

Lutz et al., "Modeling of Spiral Inductors on Lossy Substrates for RFIC Applications", Jun. 1998, IEEE MTT-S International Microwave Symposium Digest, vol. 3, pp. 1855-1858.*

* cited by examiner

*Primary Examiner*—Sun James Lin
(74) *Attorney, Agent, or Firm*—Smith & Hopen, P.A.; Anton J. Hopen; Molly L. Sauter

(57) ABSTRACT

The present invention is a substrate dependent circuit modeling system for substrate-mounted components. The height and dielectric constant of a substrate have a significant impact on the frequency response of such components, and these effects cannot be treated independently from the circuit model. The equivalent circuit parameters in the model must be made to vary in accordance with changes in the substrate. The invention includes the steps of selecting a substrate mounted electrical circuit component for which an equivalent circuit model is desired, determining equivalent circuit model input parameters, wherein some of which are dependent upon characteristics of the substrate upon which the component is mounted, for the selected component, representing the selected electrical circuit component mounted upon the substrate as an equivalent electrical circuit, formulating mathematical expressions based upon the input parameters, and creating a unique equivalent circuit model for the component mounted upon the given substrate, the unique equivalent circuit model representing the mounting of the component upon the given substrate wherein the equivalent circuit model provides behavior and performance predictions of the component based upon the given substrate characteristics.

15 Claims, 33 Drawing Sheets

Fig. 11

(a) $$ESL1(H,f)=(hb_2H^2+hb_1H+hb_3)(Lo\_a+Lo\_b*f)$$

(b) $$C_{gs}=\frac{\sqrt{\epsilon_e}}{c*Z_o}L\_Cgs$$

(c) $$Z=\frac{120\pi}{\sqrt{\epsilon_e}*\left[\frac{W}{H\_sub+H\_subf}+1.393+0.667\ln\left(\frac{W}{H\_sub+H\_subf}+1.444\right.\right.}$$

(d) $$\epsilon_e=\frac{\epsilon_r+1}{2}+\frac{\epsilon_r-1}{2}\frac{1}{\sqrt{1+12\frac{H\_sub+H\_subf}{W}}}$$

(e) $$L_{sbp}(f)=Lo\_a+Lobp\_b*f$$

(f) $$ESR(f)=R\_a+R\_b*\sqrt{f}$$

(g) $$C_{SUB}=\left(\frac{\frac{W_{cap}}{h_{SUB}}+1.393+0.667\cdot\ln(W_{cap}+1.444)}{120\cdot\pi\cdot c}\right)\cdot\frac{L_{cap}}{h_{SUB}}\cdot\epsilon_{re}$$

(h) $$C_g=\frac{C_c\cdot C_{SUB}}{C_c+C_{SUB}}$$

(i) $$ESL=L\cdot K_g$$

(j) $$K_g=K_g\_a-K_g\_b\cdot\ln\left(\frac{W_{cap}}{h_{SUB}+h_{CMC}}\right)$$

(k) $$ESL=(ESL\_a+ESL\_b\cdot f)\cdot K_g$$

(l) $$ESL'=\frac{(C_8+C_g+C)}{(C_8+C_g)\cdot C\cdot\omega_0^2}$$

(n) $$\omega_4^2=\frac{1}{L2\cdot C2}$$

(o) $$C1=\left(\frac{\omega_2^2}{\omega_1^2}-1\right)\cdot\left[\frac{C}{1-\omega_1^2\cdot ESL'\cdot C}+C_9+C_8\right]$$

(p) $$C2=(A+B+C_g)\cdot\left(\frac{\omega_4^2}{\omega_3^2}-1\right)$$

(q) $$A=\frac{C1}{(1-\omega_3^2\cdot ESL'\cdot C)}$$

(r) $$B=C_8+\frac{C}{(1-\omega_3^2\cdot ESL'\cdot C)}$$

Fig. 30

TABLE 1

| Parameter | Description | Substrate dependent |
|---|---|---|
| $M_{taper}$ | Models the stepping up or down from the 50Ω line to the inductor pad-stack | Yes |
| MLIN | Represents the area in the inductor pad-stack where there are no turns | Yes |
| MLEF | Corresponds to that space occupied by the inductor turn on the pad and takes into consideration fringing effects | Yes |
| ESR | Models coil inductor losses using an equation with DC and frequency dependent terms | No |
| $L_{sbp}$ | Models turns not lying on the substrate using an equation that includes frequency dependence | No |
| ESL1 | Bottom portion of inductor turn lying on substrate | Yes |
| ESL2 | Top portion of inductor turn lying on substrate | Yes |
| $C_{gs}$ | Represents the substrate dependent capacitance to ground formed between the inductor coils and the PCB ground plate | Yes |
| $C_{p1}$ | Models the turn to turn capacitance | No |
| $C_{p2}$ | Represents the end to end capacitance | No |

Fig. 31

TABLE 2

| Variable | Description |
|---|---|
| H(mm) | Distance from turn to ground plane |
| Lo_a (nH) | Represents the DC inductance of the coil |
| Lo_b and Lobp_b (nH/MHz) | Terms that account for skin effects at high frequencies |
| f | Frequency in MHz |
| $Hb_i$ (I=1,2,3) | Second order function coefficients |
| $\epsilon_e$ | Effective dielectric constant |
| L_$C_{gs}$ (mm) | Fitting factor added to determine the effective length of the inductor |
| C (m/s) | Speed of light |
| $Z_0$ (Ω) | Effective characteristic impedance |
| W (mm) | Inductor's turn outside width |
| H_sub (mm) | Substrate height |
| H_subf (mm) | Fitting factor used to calculate the effective distance from the inductor to the ground plate |
| $\epsilon_r$ | Substrate dielectric constant |

Fig. 32

Table 3

| Fixed Variable | Physical Interpretation | Use |
|---|---|---|
| $W_{cap}$ | Width of CMC | $C_{SUB}$, $C_g$, $K_g$ and equations (g), (h) and (j) |
| $L_{cap}$ | Length of CMC | $C_{SUB}$, and equation (g) |
| $H_{CMC}$ | Height of pseudostrip to top of microstrip surface; equal to half of capacitor thickness | $K_g$, and to obtain an approximate value of $C_c$ |
| ESR | Effective series resistance | Obtained from a resonant line technique |
| $\epsilon_r$ | Dielectric constant of substrate | See equation (g) |
| $H_{SUB}$ | Height of substrate | $K_g$, $C_{SUB}$, and equations (g) and (j) |
| $C_{SUB}$ | Capacitance from surface to ground | $C_g$ and equation (h) |

Fig. 33

TABLE 4

| | |
|---|---|
| $C_s$ | Interaction between bond pads and internal electrodes |
| $C_C$ | Capacitance from pseudostrip to top of microstrip substrate |
| Kg_a<br>Kg_b | Correction factors applied to ESL, for ground plane effects |
| ESL_a | Frequency independent effective series inductance |
| ESL_b | Frequency dependent effective series inductance |

GLOBAL EQUIVALENT CIRCUIT MODELING SYSTEM FOR SUBSTRATE MOUNTED CIRCUIT COMPONENTS INCORPORATING SUBSTRATE DEPENDENT CHARACTERISTICS

CROSS REFERENCE TO RELATED APPLICATION

This application claims benefit of now abandoned provisional U.S. Ser. No. 60/373,511 filed on Apr. 18, 2002.

BACKGROUND OF INVENTION

1. Field of the Invention

This invention relates to equivalent circuit models for substrate mounted components, and more particularly to the generation of a global equivalent circuit model for substrate mounted circuit components applicable in a CAD or CAE system wherein the model is based upon certain substrate dependent characteristics and scales according to the nominal component characteristics.

2. Background of the Invention

In the world of electronic circuit component design and fabrication, particularly in the field of RF and microwave circuit design, there is a great deal of reliance upon the availability of reliable, accurate component models. Where resistors, transistors, inductors, capacitors and other components are mounted directly upon a printed circuit board, or "substrate", it is often necessary to prepare an electrical circuit model that provides an accurate representation of a component's response and behavior. Often, models of this nature are used in conjunction with computer-aided-engineering (CAE) or electronic design automation (EDA) software. Methods currently in use to predict the response of these components include the use of scattering parameter measurements, mathematical functions and circuit parameter extraction-based models.

Measurement-based models can provide an accurate representation of a component's response, yet have been limited because de-embedding the component fixtures or its surroundings is not taken into consideration. In addition, measurement-based models require a large amount of computer storage allocation. The effects of variations in the height, the width and the dielectric constant of the substrate upon which the component rests are largely ignored.

The majority of equation-based models fail to take into consideration printed circuit board, parasitic or frequency-related effects. Further, the inherent complexity in deriving these formulas usually compromises their accuracy and range of application.

The use of equivalent circuit models, on the other hand, generally provides physical insight of the component and its fixture, requires minimal storage and memory allocation, and offers fast simulation time. However, most if not all equivalent circuit models are lacking in two very critical areas. First, as mentioned above, these models largely ignore the PCB environment. While some models may attempt to represent substrate characteristics, for example, representing bond-pad interaction in a ceramic multilayered capacitor model by a microstrip gap capacitor, the effect is insignificant, as other parasitic effects are ignored. Models that do not account for substrate effects are likely inaccurate. Second, and equally as critical, is the inability of present models to provide a general or "global" model that scales directly with component size. As an example of this second area, if a design engineer does not know the exact component value to use in a particular part of an electrical schematic, it may be necessary for the design engineer to manually choose individual models until the correct component value is found.

Therefore, in addition to creating an accurate substrate-dependent model for electrical circuit components, there is also a need in the art, particularly to facilitate CAD optimization, to create a global model that may be used to represent each family of components, i.e. one model that covers the entire range of values, for example, from 1 picofarad capacitors up to 1800 picofarad capacitors, to facilitate circuit optimization.

Accordingly, what is needed in the art is a substrate-dependent equivalent circuit model wherein the equivalent-circuit parameters utilized in the model are made to vary with changes in the substrate, as well as a global equivalent-circuit model that provides one "general" model that can be applied to a large family of components of varying size. Further, a more accurate and versatile method for analyzing surface mount performance of various types of circuit components is needed in order to significantly reduce bench time as well as the number of design cycles necessary to design new electronic products.

It is, therefore, to the effective resolution of the aforementioned problems and shortcomings of the prior art that the present invention is directed.

However, in view of the prior art at the time the present invention was made, it was not obvious to those of ordinary skill in the pertinent art how the identified needs could be fulfilled.

SUMMARY OF THE INVENTION

The present invention is a method of constructing an equivalent circuit model for substrate-mounted circuit components and, in its preferred embodiment, can be used in conjunction with computer-aided engineering software to accurately emulate the frequency performance of the components under a wide range of operating conditions. The model will provide the input to a CAE or CAD program.

This invention applies to "substrate-mounted" components, which are, naturally, mounted upon a substrate, as opposed to "integrated circuit" components, which are components built directly into the substrate. There is an obvious need for a substrate-dependent equivalent circuit model for substrate-mounted components since these components are typically individually packaged, or at least manufactured separate and apart from the substrates to which they are eventually be mounted.

The present invention includes a method for generating an equivalent circuit model to determine the behavior and frequency performance of a substrate mounted electrical circuit component mounted upon a given substrate, the equivalent circuit model incorporating substrate-dependent parameters. The techniques described herein can be applied to all types of printed transmission lines, including microstrip, coplanar waveguide, grounded coplanar waveguide, stripline and slotline products. The method includes the steps of selecting a substrate mounted electrical circuit component for which an equivalent circuit model is desired, determining equivalent circuit model input parameters, some of which are dependent upon characteristics of the substrate upon which the component is mounted, for the selected component, representing the electrical circuit component mounted upon the substrate as an equivalent electrical circuit, formulating mathematical expressions based upon the input parameters, and creating a unique equivalent circuit model for the component mounted upon the given substrate, the unique equivalent circuit model representing the mounting of the component upon the given substrate wherein the equivalent circuit model provides behavior and performance predictions of the component based upon the given substrate characteristics.

In the preferred embodiment of the invention, the step of determining equivalent circuit input parameters includes the steps of measuring substrate geometric properties and defining equation variables.

In the preferred embodiment, the invention further includes a step of expanding the unique substrate dependent equivalent circuit model over a plurality of different component values wherein the model applies to a predetermined range of values for the component thereby creating a global equivalent circuit model for accurately predicting the behavior of a range of the component values.

The method of the present invention is applicable at a fundamental resonant frequency for a given component as well as at or beyond any number of higher-order resonant frequencies of a given component.

The primary use of the equivalent circuit model of the present invention is its incorporation into a circuit simulation tool, such as a CAD or CAE system. A number of equivalent circuit models, each model corresponding to a unique element in a circuit schematic, can then be optimized using one of a variety of standard optimization techniques.

In one embodiment of the present invention, a method is provided for generating an equivalent circuit model to determine the behavior and frequency performance of a substrate mounted air coil inductor mounted upon a given substrate, wherein the air coil inductor includes a plurality of coil turns. The method includes the steps of: determining equivalent circuit model input parameters, some of which are dependent upon characteristics of the substrate upon which the inductor is mounted, the substrate characteristics including but not limited to, substrate thickness, substrate height, dielectric constant of the substrate and substrate loss tangent; representing the inductor mounted upon the substrate as an equivalent electrical circuit; calculating substrate dependence inductance terms based upon the input parameters; and creating a unique equivalent circuit model for the inductor upon the given substrate, the unique equivalent circuit model representing the mounting of the inductor upon the given substrate wherein the equivalent circuit model provides behavior and performance predictions of the inductor based upon the given substrate characteristics.

In the method provided by the invention for generating an equivalent circuit model to determine the behavior and frequency performance of a substrate mounted air coil inductor mounted upon a given substrate, the step of calculating a substrate dependent inductance term based upon the input parameters further includes the step of representing the inductance term as a function of the inductor's coil to substrate relationship, wherein the step of representing the inductance term as a function of the inductor's coil to substrate relationship uses the following equation:

$$ESL\ (H,f)=(hb_2H^2hb_1H+hb_3)(L\_a+L_0\_b*f)$$

wherein:

ESL represents a bottom portion of the inductor turn lying on the substrate;

H represents a distance from the turn to a ground plate;

f represents frequency;

hb1, hb2 and hb3 represent polynomial function coefficients;

$L_0$_a represents a DC inductance of the coil; and $L_o$_b represents skin effects at high frequencies.

The above equation may also be used where ESL represents a top portion of the inductor turn lying on the substrate.

In the method provided by the invention for generating an equivalent circuit model to determine the behavior and frequency performance of a substrate mounted chip inductor mounted upon a given substrate, a substrate dependent capacitance is formed between the inductor coil and the substrate, wherein the substrate dependent capacitance is a function of the substrate's dielectric constant and the effective characteristic impedance.

In another embodiment of the present invention a method is provided for generating an equivalent circuit model to determine the behavior and frequency performance of a substrate mounted chip inductor mounted upon a given substrate, wherein the chip inductor includes a plurality of coil turns in a surface-mounted package. The method includes the steps of: determining equivalent circuit model input parameters, some of which are dependent upon characteristics of the substrate upon which the inductor is mounted, the substrate characteristics including but not limited to, substrate thickness, substrate height, dielectric constant of the substrate and substrate loss tangent; representing the inductor mounted upon the substrate as an equivalent electrical circuit; calculating substrate dependent inductance terms based upon the input parameters; and creating a unique equivalent circuit model for the inductor upon the given substrate, the unique equivalent circuit model representing the mounting of the inductor upon the given substrate wherein the equivalent circuit model provides behavior and performance predictions of the inductor based upon the given substrate characteristics.

In the method provided by the invention for generating an equivalent circuit model to determine the behavior and frequency performance of a substrate mounted chip inductor mounted upon a given substrate the step of calculating substrate dependent inductance terms based upon the input parameters further includes the step of representing the inductance terms as a function of the effective chip inductor body width, substrate thickness and metal trace thickness upon which the inductor is mounted, wherein the step of representing the inductance terms uses the following equation:

$$ESL\ (H,W,T)=(L\_nom)*(Kg\_a-Kg\_b)*(\text{In}(W/(H+t)))$$

wherein:

ESL represents an effective series inductance of the inductor as mounted upon the substrate;

H represents the thickness of the substrate;

W represents the effective chip inductor body width;

T represents the thickness of metal trace to which the inductor is mounted upon the substrate;

L_nom represents nominal inductance of the inductor; and

Kg_a and Kg_b represent fitting coefficients.

In another embodiment of the present invention a method is provided for generating an equivalent circuit model to determine the behavior and frequency performance of a substrate mounted chip resistor mounted upon a given substrate. The method includes the steps of: determining equivalent circuit model input parameters, some of which are dependent upon characteristics of the substrate upon which the resistor is mounted; representing the resistor mounted upon the substrate as an equivalent electrical circuit; calculating substrate dependence inductance terms based upon the input parameters; and creating a unique equivalent circuit model for the chip resistor upon the given substrate, the unique equivalent circuit model representing the mounting of the resistor upon the given substrate wherein the equivalent circuit model provides behavior and performance predictions of the resistor based upon the given substrate characteristics.

In the method provided by the invention for generating an equivalent circuit model to determine the behavior and frequency performance of a substrate mounted chip resistor mounted upon a given substrate, the step of calculating substrate dependent inductance terms based upon the input parameters further includes the step of representing the inductance terms as a function of the effective chip resistor body width, substrate thickness and metal trace thickness upon which the resistor is mounted, wherein the step of representing the inductance terms uses the following equation:

$$ESL\ (H,W,T)=ESL\_a+ESL\_b*\mathrm{freq}*1e-9)*\ (Kg\_a\ Kg\_b*\mathrm{In}(Wf/(H\_\mathrm{sub}+H\_res+T\_\mathrm{mtl})))$$

wherein:

ESL represents an effective series inductance of the resistor as mounted upon the substrate;

ESL_a, ESL_b, Kg_a and Kg_b are fitting parameters;

Wf represents the effective chip resistor body width;

H_sub represents a thickness of the substrate;

H_res represents the effective height of the resistor above a top surface of the substrate to which it is mounted; and T represents the thickness of the metal trace to which the resistor is mounted upon the substrate.

In one embodiment of the present invention, the present invention is a circuit simulation apparatus comprising input circuit parameters, and processing means for determining optimal circuit components, wherein the processing means utilize an equivalent circuit modeling system that determines the behavior and frequency performance of the circuit components as a function of the characteristics of a substrate upon which each circuit component is mounted. The equivalent circuit modeling system can be expanded over a plurality of different circuit component values wherein the modeling system applies to a predetermined range of values for the circuit component thereby creating a global equivalent circuit modeling system for accurately predicting the behavior of a range of circuit component values.

In an alternate embodiment of the present invention, a computer program is stored in a computer readable medium embodying instructions to perform a method for generating an equivalent circuit model to determine the behavior and frequency performance of a substrate mounted electrical circuit component mounted upon a given substrate, the equivalent circuit model incorporating substrate-dependency parameters. The method includes the steps of: where upon a selection of the component, determining equivalent circuit model input parameters, some of which are dependent upon characteristics of the substrate upon which the component is mounted, for the selected component; representing the electrical circuit component mounted upon the substrate as an equivalent electrical circuit; formulating mathematical expressions based upon the input parameters; and creating a unique equivalent circuit model for the component mounted upon the given substrate. The unique equivalent circuit model represents the mounting of the component upon the given substrate wherein the equivalent circuit model provides behavior and performance predictions of the component based upon the given substrate characteristics.

It is therefore an object of the present invention to provide an equivalent circuit modeling system that accounts for parasitic and substrate effects present in substrate mounted circuit components.

It is also an object of the present invention to provide an improved CAD or CAE system that utilizes, as its input parameters, substrate-dependent variables in order to produce a more accurate circuit design model.

It is another object of the present invention to provide an equivalent circuit modeling system that reduces design time and circuit fabrication effort thereby saving design engineers and manufacturers time and money.

It is yet another object of the present invention to provide an equivalent circuit modeling system that can be globalized to optimize component value and substrate parameters to allow design engineers to find the best part and/or substrate needed for a desired circuit performance.

It is to be understood that both the foregoing general description and the following detailed description are explanatory and are not restrictive of the invention as claimed. The accompanying drawings, which are incorporated in and constitute part of the specification, illustrate embodiments of the present invention and together with the general description, serve to explain principles of the present invention.

These and other important objects, advantages, and features of the invention will become clear as this description proceeds.

The invention accordingly comprises the features of construction, combination of elements, and arrangement of parts that will be exemplified in the description set forth hereinafter and the scope of the invention will be indicated in the claims.

BRIEF DESCRIPTION OF DRAWINGS

For a fuller understanding of the nature and objects of the invention, reference should be made to the following detailed description, taken in connection with the accompanying drawings, in which:

FIG. 11 is a listing of relevant equations used in the equivalent circuit model of the present invention as pertaining to air coil inductors.

FIG. 30 is Table 1.

FIG. 31 is Table 2.

FIG. 32 is Table 3.

FIG. 33 is Table 4.

DETAILED DESCRIPTION OF THE INVENTION

Specific examples of substrate dependent equivalent circuit models for substrate-mounted inductors and capacitors will be provided herein although the present invention 10 is equally applicable to other components such as, but not limited to, resistors, transistors, diodes, filters and amplifiers as well as various other types of printed circuit board structures. The invention is preferably used to provide models that are delivered to custom libraries and inserted into Computer Aided Design (CAD) or Computer Aided Engineering (CAE) systems.

Figure 1:
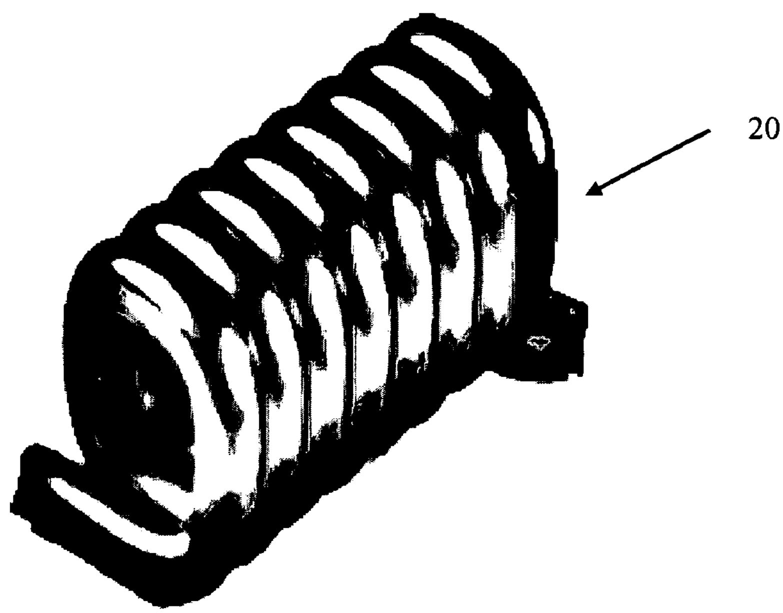
FIG. 1 is a top perspective view of a typical air coil inductor mounted upon a substrate.
Figure 2:
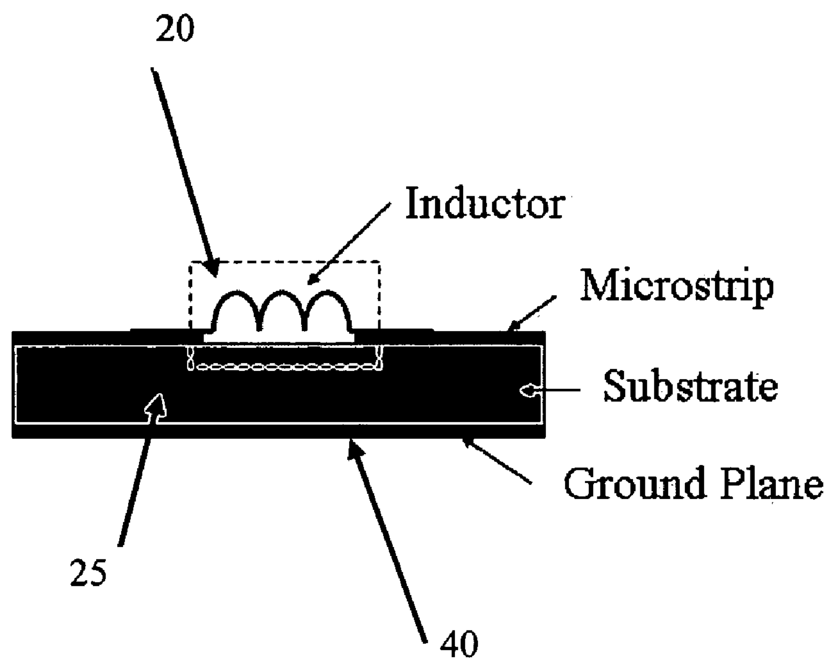
FIG. 2 is a side cross-sectional view of a typical air coil inductor mounted upon a substrate.

FIGS. 1 and 2 show a typical air coil inductor 20 mounted on a substrate 25. The size, properties and effects of substrate 25 is largely ignored in prior art circuit models.

Figure 3:
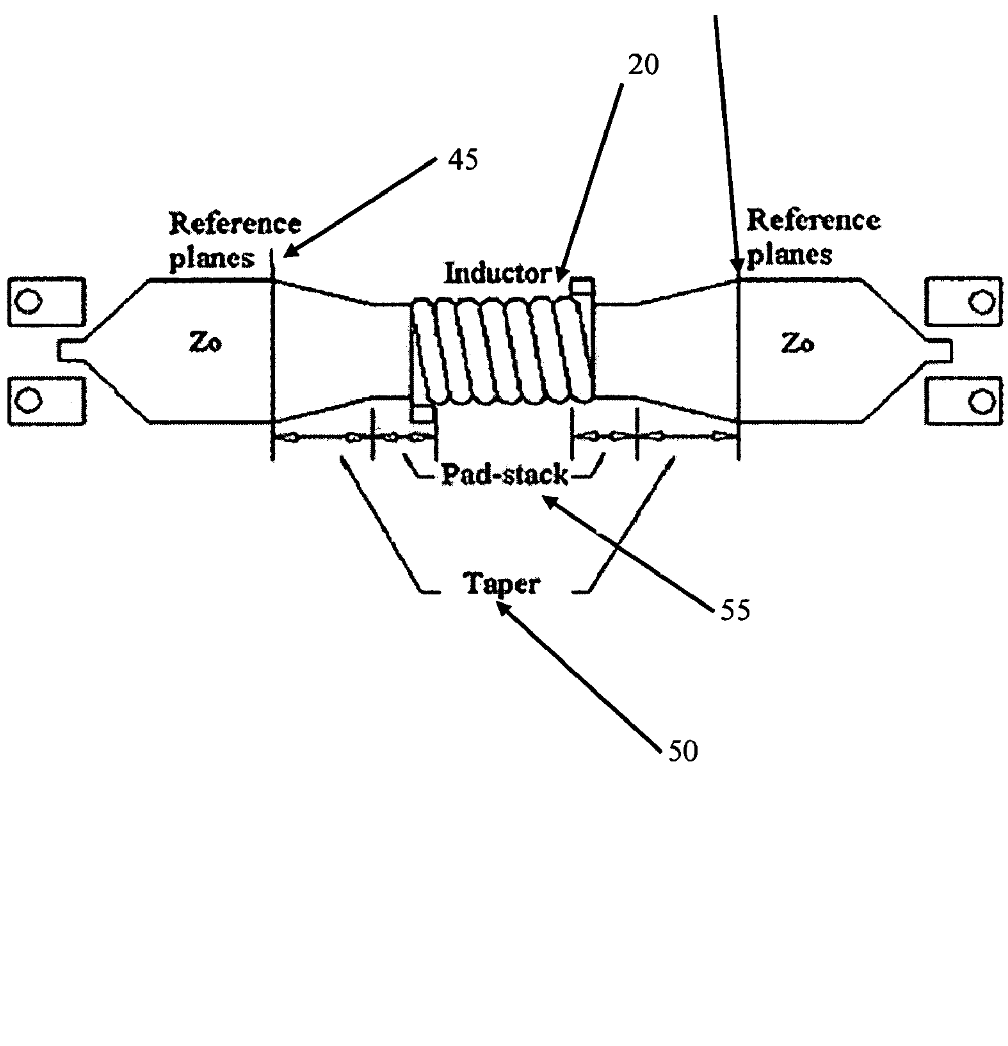
FIG. 3 is a top view of a series-thru fixture utilized to measure an inductor in order to provide fixed input parameters to the modeling system.
Figure 4:
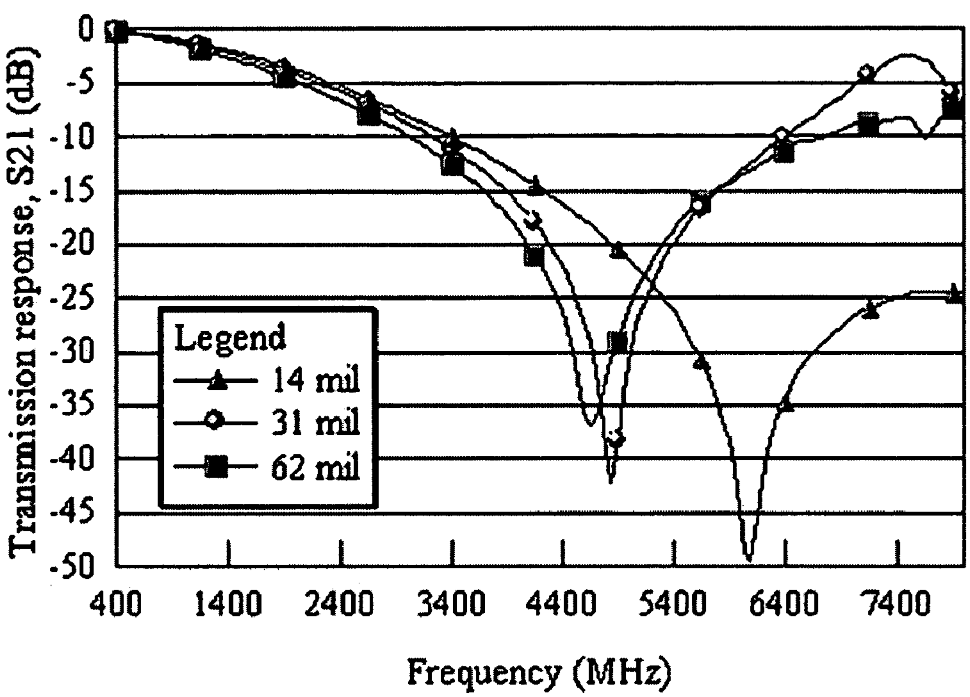
FIG. 4 is a graphical representation of the transmission response of a series-mounted 10 nH air coil inductor mounted on three different substrate sizes, illustrating substrate dependency.

FIG. 3 shows a series-thru fixture utilized to measure an inductor 20, while FIG. 4 illustrates the transmission response, in dBs, of a typical 11.03 nH inductor mounted upon three different sized substrates; 14, 31 and 62 mil FR-4 substrates. As shown clearly in FIG. 4, there is a direct relationship between substrate thickness and the response of the inductor. This dependency plays a vital role in the substrate-dependent model of the present invention.

Figure 5:
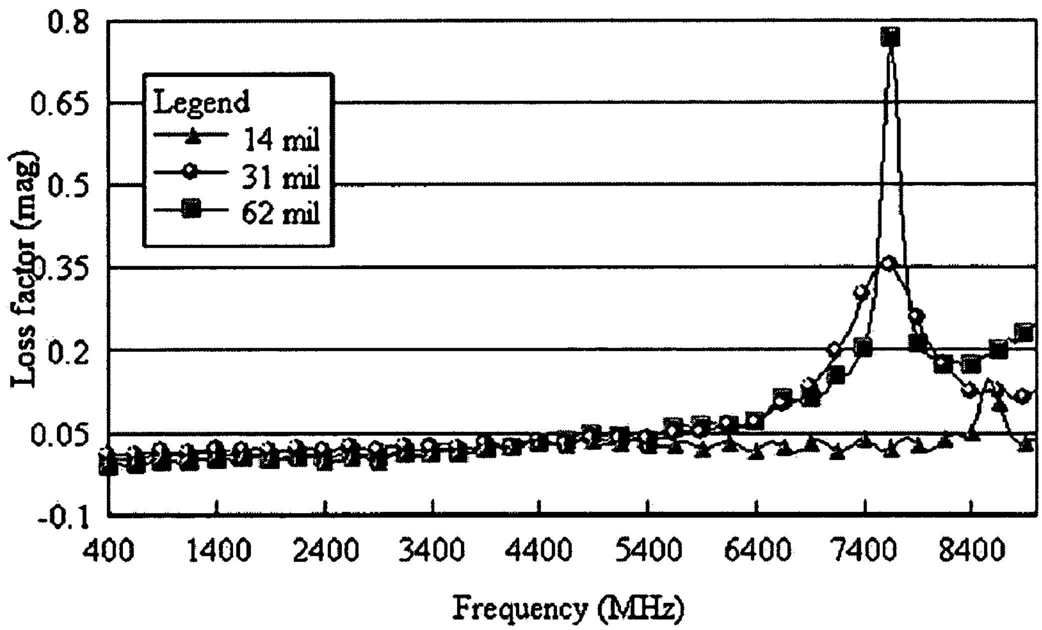
FIG. 5 is a graphical representation of the total radiation loss of a typical inductor mounted on three different substrate sizes.

In addition to inductor response, the size and properties of substrate 25 upon which inductor 20 is mounted also plays a significant role in the total radiation loss of the inductor. FIG. 5 is a graphical representation of the radiation losses of the same size inductor (11.03 nH) on the same three substrates, 14, 31 and 62 mils. Again, it is clear that the radiation losses exhibited by inductor 20 depend upon the substrate used. This dependency cannot accurately be represented in basic prior art R-L-C models.

Figure 6:
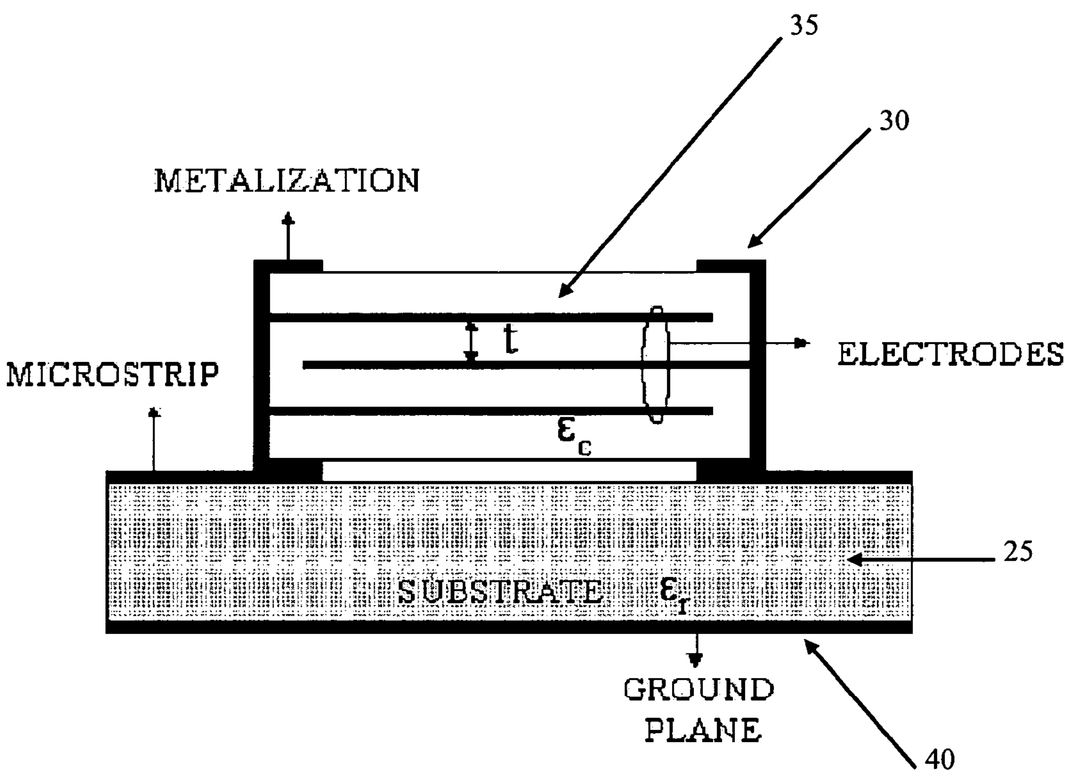
FIG. 6 is a side cross-sectional view of a ceramic multilayer capacitor in a typical microstrip mount upon a substrate.
Figure 7:
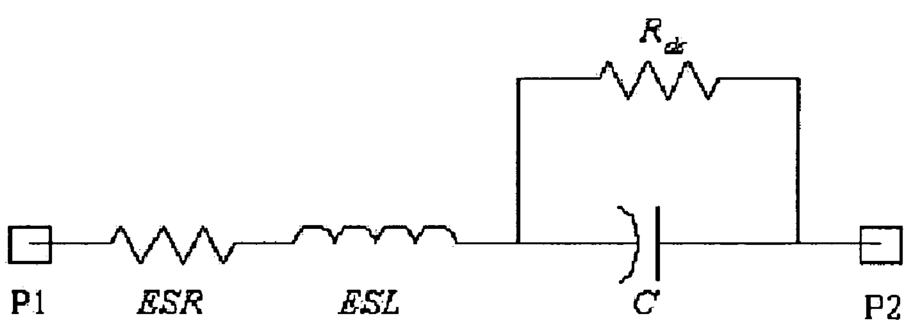
FIG. 7 is an electrical circuit representation of a prior art equivalent circuit model used for ceramic multilayer capacitors, generally valid only at low microwave frequencies.

Similar substrate dependency exists in substrate mounted ceramic multilayer capacitors (CMCs). FIG. 6 shows a cross sectional view of a typical CMC 30 mounted upon a substrate 25. FIG. 7 represents a prior art equivalent lumped-element circuit model of the CMC in FIG. 6. The effective series resistance (ESR) represents the resistance of the electrodes 35 and inner electrode terminations. This resistance usually ranges from 0.01Î©to 1Î©. The parasitic inductance of inner electrodes 35, known as the effective series inductance (ESL) and the nominal capacitance is denoted by C. An additional resistor in parallel to C, $R_{dc}$, can be used to account for dielectric loss. However, in this prior art model, the effects of microstrip ground plate 40 is ignored. In practical microwave applications, however, the performance of capacitor 30 is significantly altered by the presence of the ground.

Figure 8:
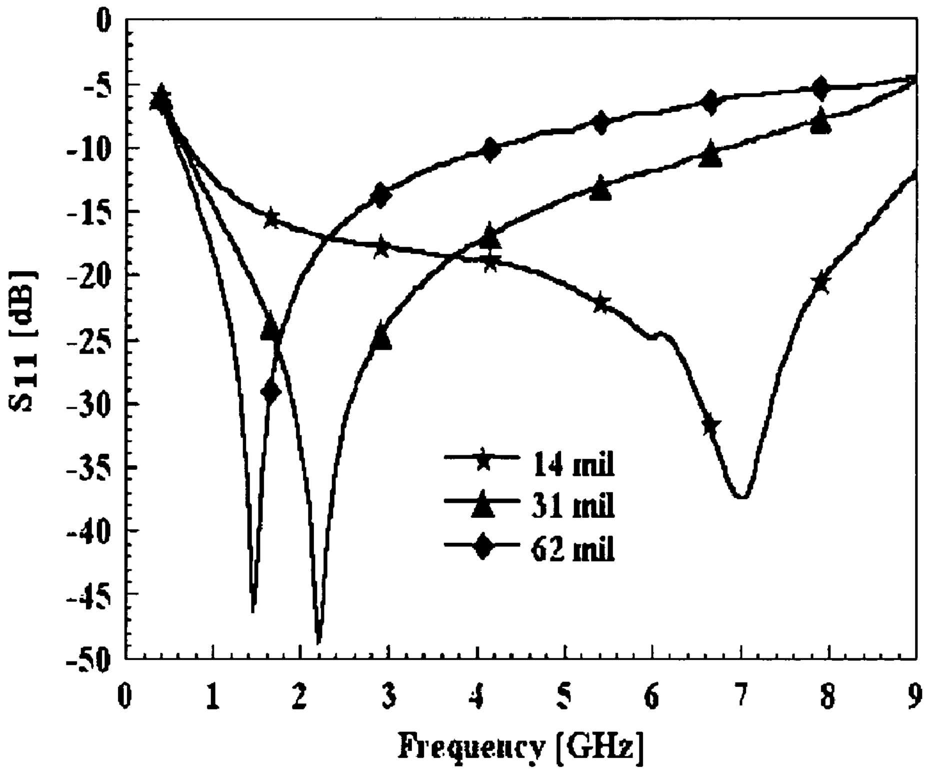
FIG. 8 is a graphical representation of the frequency-dependent $S_{11}$ (reflection coefficient) response of a ceramic multilayer capacitor for three different substrates.

In FIG. 8, it is once again evident that the size of the substrate (14-, 31-, and 62-mils thick) upon which a typical (6.8 pF) capacitor rests significantly affects the response.

Figure 10:
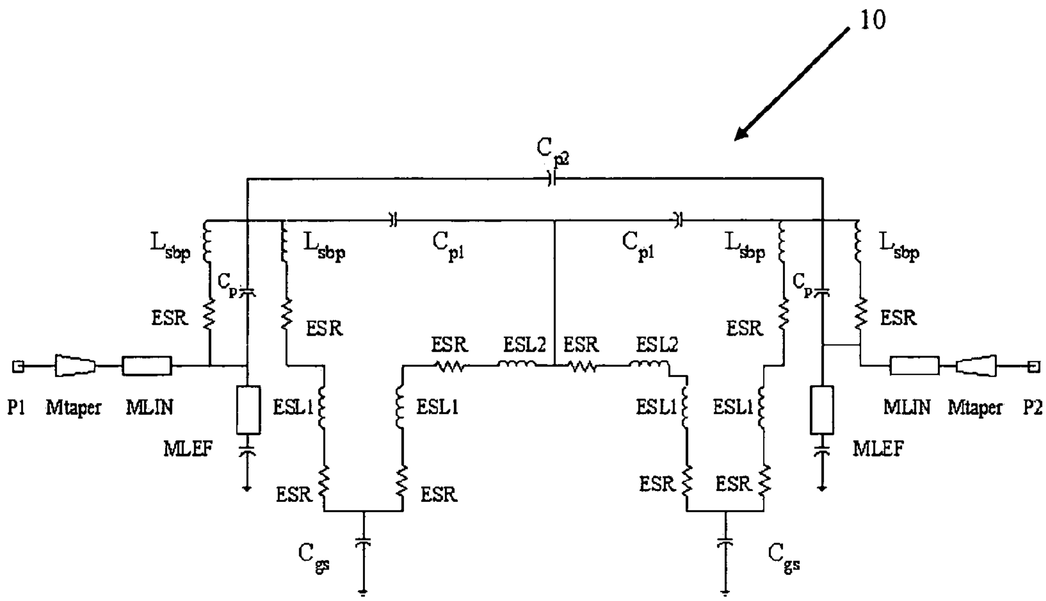
FIG. 10 illustrates the substrate dependent equivalent circuit model of the present invention for air coil inductors.

Referring once again to the air coil inductor application (for an 11.03 nH inductor), to ensure a satisfactory physical representation of inductor 20 and appropriate substrate characteristics, the present invention 10 provides a circuit emulating the physical mounting of the inductor on the fixture. This circuit is shown in FIG. 10. In order to illustrate the approach used to attribute unique characteristics to separate sections of the inductor, FIG. 10 illustrates the model given in its most detailed format. When finally implemented in a circuit simulator, several neighboring elements may be combined to enhance computational efficiency. For example, the separate ESR and ESL elements can be lumped together.

In one embodiment of the present invention as applied to inductors, the model accepts as input parameters, dielectric constant, substrate metal thickness, substrate height, and the substrate loss tangent. All user defined variables are scalable and the resultant models account for fundamental resonance and two or more higher order resonant pairs, which aids harmonic balance simulation due to the accuracy at harmonic frequencies.

In order to generate a substrate dependent model for an air coil inductor 20, S-parameter measurements must be taken for multiple samples of typical inductors on multiple substrates in order to determine certain input values. This ensures scalability of the model for a wide range of substrate thicknesses and dielectric constants.

A typical inductor 20 can be measured using a number of different measurement techniques including a Thru-Reflect-Line (TRL) calibration technique using uniform microstrip lines as shown in FIG. 3. The reference planes 45 are located at the outside edges of the fixture taper section 50 that connects to the inductor padstacks 55 (the microstrip geometry upon which the inductor is mounted). FIG. 3 shows a series-through (2 port) fixture used in measuring inductor 20. The taper 50 is shown in exaggerated form for clarity. The reference characteristic impedance is 50 Î©. The inductor can be measured using a variety of systems such as a Wiltron Â® 360B network analyzer, a wafer-probe station, and a personal computer with WincalÂ® software.

The Table 1 (FIG. 30) provides a description of the elements used in the substrate and frequency dependent model of the present invention for air coil inductors.

A key element of the equivalent circuit modeling system of the present invention is the turn-to-turn modeling approach of the present invention. It consists of breaking up the inductor turns that lay on substrate 25 into two parts; the top part (ESL2) and the bottom part (ESL1).

The Table 2 (FIG. 31) provides a description of the variables used in calculating the substrate dependent terms used in the model:

Second order polynomial functions are used to predict the substrate dependent inductance terms. Referring now to FIG. 11, which shows the relevant equations in the model of the present invention 10, equation (a) represents a function for the bottom portion of the inductor turn (ESL1) that is dependent upon the distance between the turn portion being simulated and the board ground plane, H. The coefficients are interpolated internally within the simulator and a distinction is drawn for the top and bottom portions of the turns, The coefficients Lo_a and Lo_b are optimized within the simulator using initial estimates. ESL2 is calculated with a similar equation but using different coefficient and height values. The capacitance-to-ground $C_{gs}$, is calculated using a microstrip approximation as shown in equation (b), where $Z_0$ is defined in equation (c) and Î$\mu_e$ is defined in equation (d).

A fitting factor, H_subf, is utilized to introduce an additional degree of freedom in the calculation of the effective distance from the inductor to the ground plane. These factors (e.g. H_sub and L_$C_{gs}$) can be attributed to tolerances in the fabrication of the board and nominal dimensions of the inductor's geometry. The scaling also helps to compensate for the rounded nature of the coil since the formula applies generally to flat conductors.

The inductance of the end turn that rests on the inductor stack, $L_{sbp}$, is calculated using equation (e) in FIG. 11. This equation assumes no substrate dependency due to the barrier presented by the pad stack between the coil and the board ground plate. Any substrate dependent inductance present in the turn is absorbed by the MLEF element (Table 1, above). The coefficients Lo_a and Lobp_b are optimized within the simulator using initial estimates. The end-to-end and turn-to-turn capacitors, which are not substrate dependent, are estimated and then optimized in the simulation with the following inequality, $C_{p2}<C_{p1}$. The effective series resistance (ESR), which is also not substrate dependent, is calculated as shown in FIG. 11, equation (f). The ESR is calculated as the sum of the DC and the AC resistance. The AC resistance is accounted for in the R_b coefficient of the equation.

The average value of $C_p$ is determined by calculating the upper and lower limits of the capacitance using microstrip and parallel plate approximations, respectively. The final value will be obtained from optimizations that are bounded by the upper and lower limits.

Figure 12:
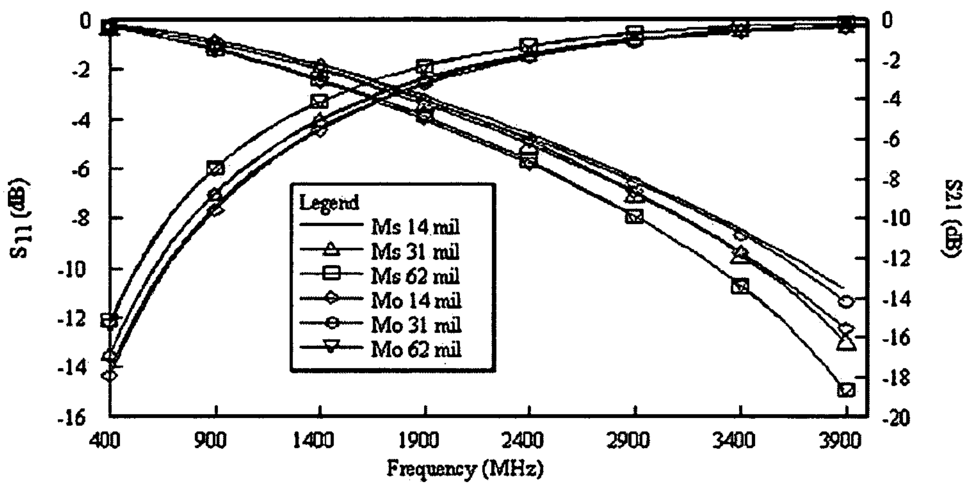
FIG. 12 graphically illustrates a comparison of measured data and modeled predictions for $S_{21}$ and $S_{11}$ responses of an 11.03 nH air coil inductor mounted on three different-sized substrate sizes.
Figure 13:
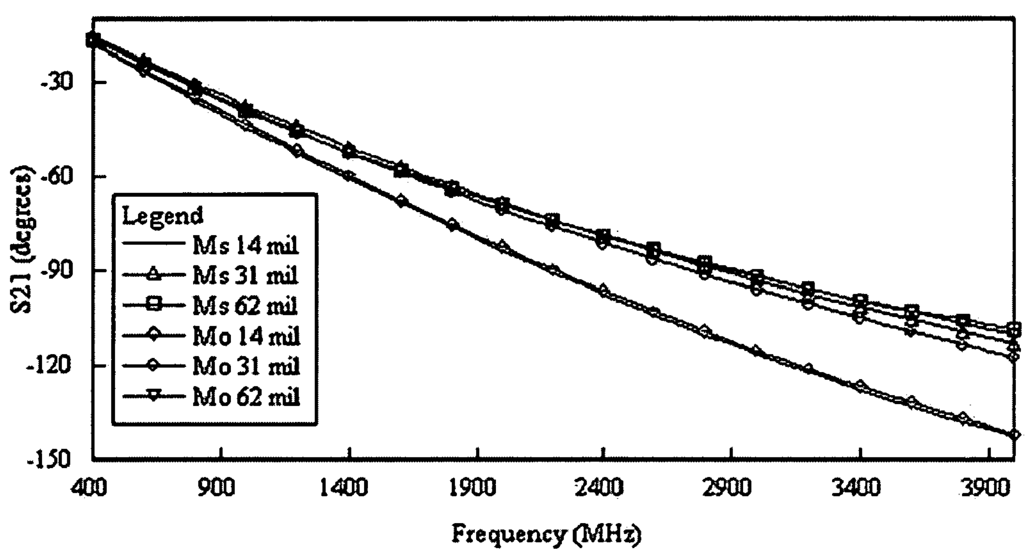
FIG. 13 is another graphical comparison of the $S_{21}$ (transmission coefficient) response of an 11.03 nH air coil inductor for three different-sized substrates with the measured data.

Once starting values and equations are entered for each of the elements, models corresponding to each substrate are optimized using one of any available common optimization techniques. A simultaneous optimization method is preferred, in which the circuit parameters pertaining to the substrate dependent model are optimized such that the model emulates measurement data from multiple substrate types simultaneously. FIGS. 12 and 13 show a comparison of generated models for three different substrates with measured data for the 11.03 nH inductor. As shown clearly in these figures, the model of the present invention 10 is able to accurately predict the $S_{11}$ and $S_{21}$ responses with minimal error.

Figure 9:
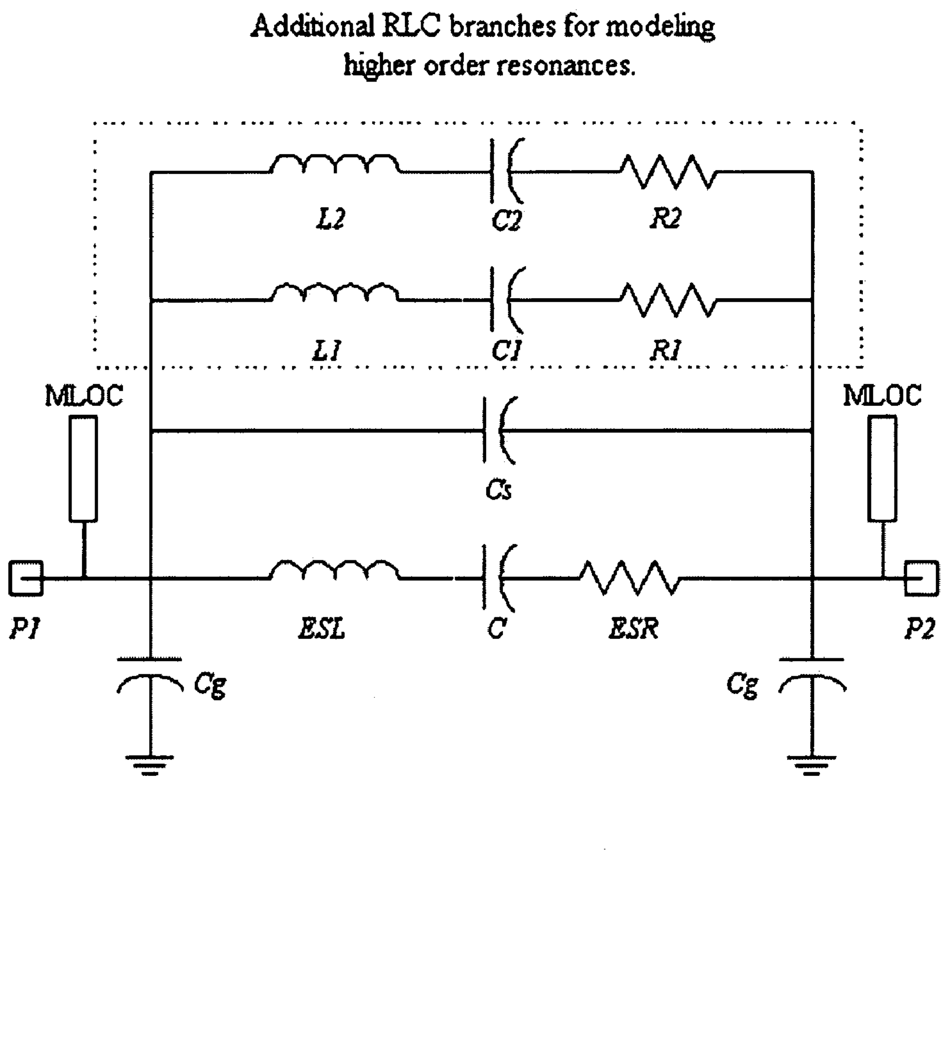
FIG. 9 illustrates the substrate dependent equivalent circuit model of the present invention for ceramic multilayer capacitors showing additional RLC branches for modeling of higher order resonances.

An improvement upon prior art equivalent circuit models, like the kind shown in FIG. 7 which is a non-substrate dependent model for a ceramic multilayer capacitor (CMC) at low frequencies, is shown in FIG. 9. FIG. 9 is comprised of a series RLC circuit in combination with capacitors to ground $C_g$ and a capacitance that represents the interaction between the capacitor bond pads $C_s$. The parallel resistor in FIG. 7 ($R_{dc}$) is discarded as it provides a direct current path from input to output, which is a potential problem when simulations are carried out using computer-aided engineering (CAE) tools such as SPICE. In order to solve the problem of having a direct current path, capacitor C in FIG. 9 may be modeled as a capacitor with a finite quality factor Q (CAPQ). Assuming conductor loss is modeled using ESR, the dielectric loss can be accounted for by the Q of the capacitor. FIG. 9 includes two RLC branches for modeling high order resonances, on the top portion of the circuit. Additional RLC branches can be added to account for additional higher order resonances.

Figure 14:
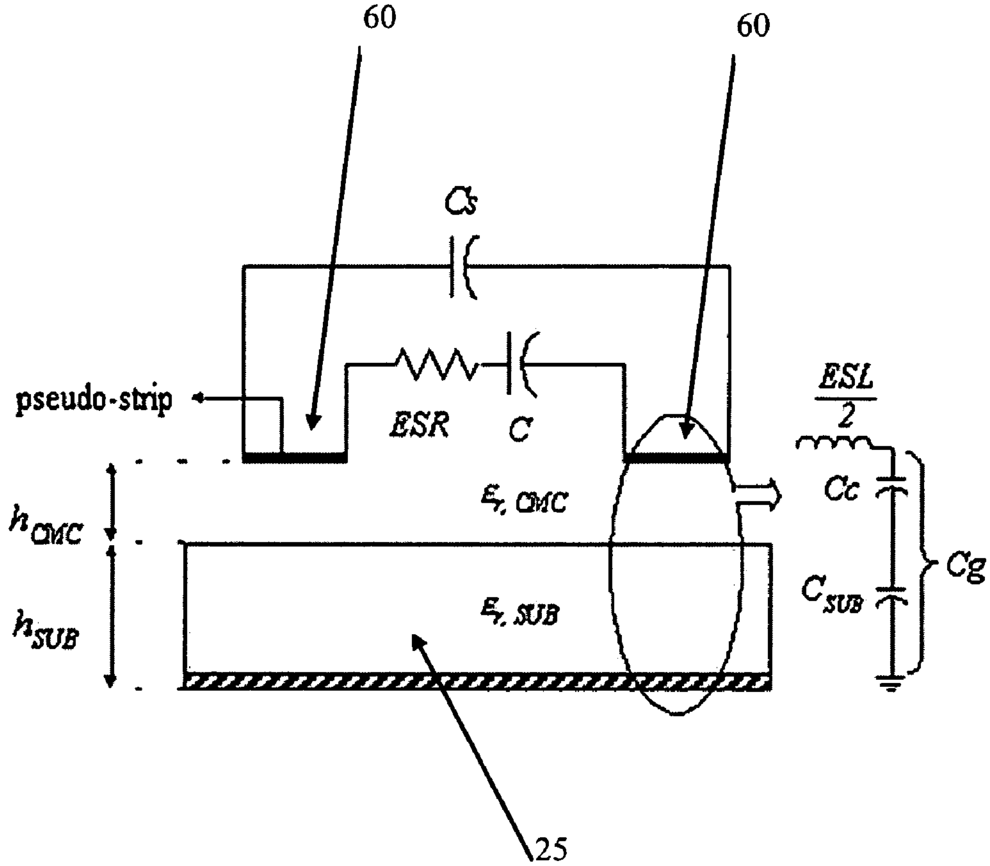
FIG. 14 is an equivalent circuit representation of the ceramic multilayer capacitor of FIG. 6.

The parameters for the new model generated by the present invention 10 are determined by treating CMC 30 as shown in FIG. 14. The solid lines in the lower figure represent pseudomicrostrip lines 60, assumed to be located near the middle of CMC 30. Here, the model is comprised of lumped-sum parameters (ESR, C and $C_s$) and two sections of pseudomicrostrip line 60. The signal strip of the microstrip line represents an approximate composite of the internal electrodes 35 of CMC 30 (as shown in FIG. 6) and is assumed to be located near the vertical center of the capacitor. The substrate 25 supporting the strip is formed of two layers: the regular microstrip substrate and a layer representing the dielectric of the CMC itself. The inductance and the capacitance of the pseudomicrostrip 60 are related to the parameters ESL and $C_g$. The nominal capacitance C is set to the assigned value for the particular CMC. The ESR is determined using a resonant line technique and modeled using a two-term polynomial equation. $C_g$ is typically determined from circuit optimization, although an approximate value can be calculated from the physical dimensions of CMC 30.

The parameter $C_g$, shown in FIGS. 9 and 14 is considered to be a combination of two capacitors in series. The first is an intrinsic capacitance ($C_c$) representing the capacitance from the pseudostrip 60 to the top of the microstrip substrate 25, and is indicated over the layer $h_{CMC}$ in FIG. 14. A preliminary value for $C_c$ can be obtained by treating pseudostrip 60 and the top of substrate 25 as a parallel-plate capacitor. However, since an approximate representation of the internal electrode geometry is being applied, the final value for $C_c$ must be determined using circuit optimization.

The second capacitor ($C_{SUB}$) is an extrinsic capacitance representing the capacitance from substrate 25 to the ground, and is shown over layer $h_{SUB}$ in FIG. 14. The capacitance $C_{SUB}$ is calculated from the knowledge of the effective dielectric constant (Î$\mu_{re}$), the height of the substrate ($h_{SUB}$), and the assumed width of pseudostrip 60, which is equal to the capacitor width ($W_{cap}$), using ideal transmission-line theory. The effective dielectric constant is computed from the substrate dielectric constant using standard equations for a strip of width $W_{cap}$. The equations for $C_{sub}$ and $C_g$ are given in FIG. 11, equations (g) and (h), where $L_{cap}$ is the physical length of CMC 30.

A dependence on substrate height is also incorporated into the equations used to evaluate the inductance of the pseudostrip (ESL). In FIG. 11, equations (i) and (j), L represents the intrinsic strip inductance, with the ground set to infinity, $K_g$ is a correction factor that depends on the strip width and distance to ground, and $W_{CAP}$ is the width of the capacitor. The equations (i) and (j) predict a decrease in ESL as $h_{SUB}$ decreases, leading to the increase in resonant frequency demonstrated in FIG. 8. In this figure, the coefficients $K_{g\text{-}a}$ and $K_{g\text{-}b}$ are determined using circuit optimization during the model extraction process.

The inductance of the capacitor also varies with frequency due to skin-depth effects and because of the changes in the current distribution along the CMC bond pads. The frequency dependence is accounted for by including an additional term into the intrinsic inductance as shown in the FIG. 11, equation (k). In this formula, f is the frequency (in gigahertz). The coefficients ESL_a and ESL_b are determined using circuit optimization.

In summary, the CMC substrate dependent model that accounts for the first series resonance contains six free variables, namely, $C_s$, $C_c$, Kg_a, Kg_b, ESL_a, and ESL_b and seven fixed parameters, namely, Wcap, Lcap, $h_{SUB}$, $h_{CMC}$, $C_{SUB}$, ESR, and Î$\mu_r$.

Accurate modeling of surface mount capacitors at high frequencies requires higher order resonances to be taken into account. Theoretically, n pairs of series/parallel resonances can be modeled by adding n resonant branches in parallel to the RLC branch. Frequencies at which these higher order resonances occur are to first-order independent of the substrate used, in strong contrast to the primary series resonance. This fact greatly reduces the computational resources that are required for model extraction. The method for calculating starting values for additional elements assumes a prior knowledge of the fundamental and higher order resonant frequencies, which are experimentally determined.

The substrate dependent model of the present invention 10 is used as the starting point to derive analytical expressions for the equivalent circuit parameters in the additional branches, shown within the dotted lines in FIG. 9. In order to reduce the complexity of the resulting expressions, the ESR parameter is excluded, introducing an error of the order of 10% or less in the resulting parameter values. This step is justified in that the expressions presented below are used only as initial values to improve the rate of convergence during circuit optimization.

Table 3 (FIG. 32) lists the physical interpretation of and equations where fixed variables are used.

Table 4 (FIG. 33) lists the physical interpretation of free variables in the model that are determined using circuit optimization.

The relationship between the fundamental series resonant frequency (Ï·$_0$) and an approximate strip inductance (ESL') is given in equation (I) of FIG. 11. The substrate-dependent parameter in this equation are $C_g$ and Ï·$_0$.$C_g$ has typical value ranges from 0.09 pF for a 62-mil thick FR-4 substrate) to 0.19 pF (for a 14-mil thick FR-4 substrate). The fundamental resonant frequency (Ï·$_0$) the first higher order resonant pair (Ï·$_1$,Ï·$_2$), and the second higher order resonant pair (Ï·$_3$, Ï·$_4$) are experimentally determined by measuring the two-port S-parameters of the capacitor. $C_g$ and Ï·$_0$ are substrate dependent parameters.

Each individual LC network inside the dotted lines of FIG. 9 has a series resonant frequency at Ï·$_2$ and Ï·$_4$, which is related to L1, C1, L2, and C2, as shown in FIG. 11, equations (m) and (n). In order to calculate C1, the input impedance ($Z1_{in}$), as seen from P1 for the combination of the fundamental branch, and the LC network (L1, C1), is calculated. A pair of equations relating L1 and C1 is obtained using Equation (m) and by equating $Z1_{in}$ to infinity at the first parallel resonant frequency (Ï·$_1$). Solving the equations simultaneously yields the result for C1 as shown in equation (o).

The capacitor C2 is evaluated after deriving the expression for $Z2_{in}$, which will consist of three LC networks; an LC network for the fundamental series resonance and two LC networks for two higher order resonant pairs. Setting $Z2_{in}$ to infinity at Ï·$_3$ and using equation (n) in FIG. 11, a unique value of C2 is obtained as shown in equation (p). The relationships for A and B are given in equations (q) and (r), respectively. The expressions of equations (q) and (r) provide starting values for the elements in the added resonant branches, thereby reducing the time required for the optimizer to converge to the final value.

Figure 15:
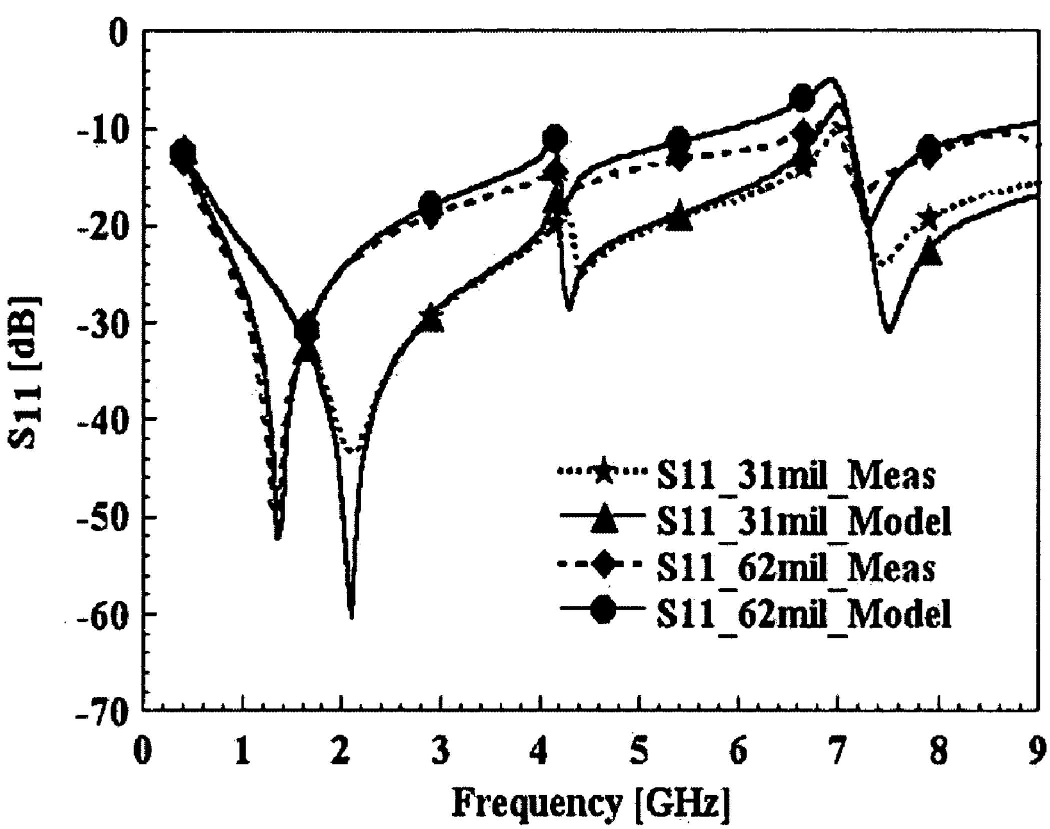
FIG. 15 is a graphical comparison of $S_{11}$ magnitude using a CAD version of the global model of the present invention for three different sized substrates vs. the measurements for a 22 pF ceramic multilayer capacitor.
Figure 16:
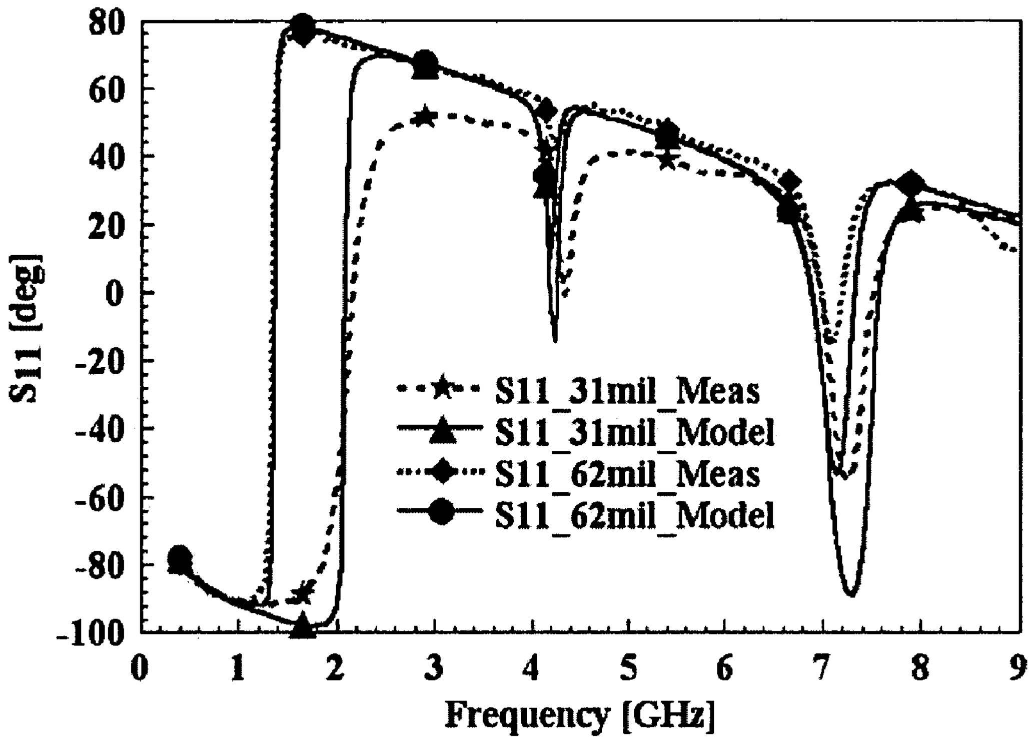
FIG. 16 is a graphical comparison of $S_{11}$ phase using a CAD version of the global model of the present invention for three different sized substrates vs. the measurements for a 22 pF ceramic multilayer capacitor.

The equivalent circuit modeling system of the present invention 10 can provide the input parameters in a CAD system, in order to allow design engineers to quickly and accurately choose proper components when designing electrical circuits. The size of the substrate upon which the chosen component rests is factored into the decision. In order to illustrate the effectiveness of a computer-aided design (CAD) model utilizing the present invention, measured and predicted $S_{11}$ parameters for a 15-pF 0805-style CMC are shown in FIGS. 15 and 16 for magnitude and phase, respectively. Without any loss of generality, it is intuitively clear that the other S-parameters ($S_{21}$, $S_{12}$ and $S_{22}$) will show a good agreement with the measured data. The results pertain to a capacitor mounted in a series two-port microstrip configuration in three different FR-4 board heights. The effective dielectric constant and loss tangent for FR-4 are approximately equal to 3.3 and 0.022, respectively. By changing only the height of the microstrip substrate, the model is able to accurately capture significant changes in the frequency response. The measured data shown in these figures were those used in the model extraction/optimization process.

The present invention model can be expanded to more than one component value. For example, it may be desirable for a design engineer to access a model that is not limited to only one size capacitor, or one size inductor. Instead of examining individual models, one for each component size, model development for an entire family of capacitors or inductors can be created and which may contain 60 or more individual capacitor or inductor sizes. This can be accomplished efficiently using interpolation. Free variables in the CMC or inductor models vary in a reasonably uniform manner versus capacitance or inductor value. Parameter values for intermediate component sizes can be predicted with a high degree of accuracy. The uniform variation of the parameters is a consequence of the model being closely tied to the physical properties of the CMC or inductor. Therefore, the modeling system of the present invention can be expanded to a large range of component values.

In order to facilitate CAD optimization, global $C_C$ models can be developed in which the equivalent-circuit parameters are expressed as polynomial equations in terms of the nominal capacitance value (C). An n-th-order polynomial curve of interpolated values shows that a single equation can be used for each parameter over the entire range of capacitor values.

Figure 17:
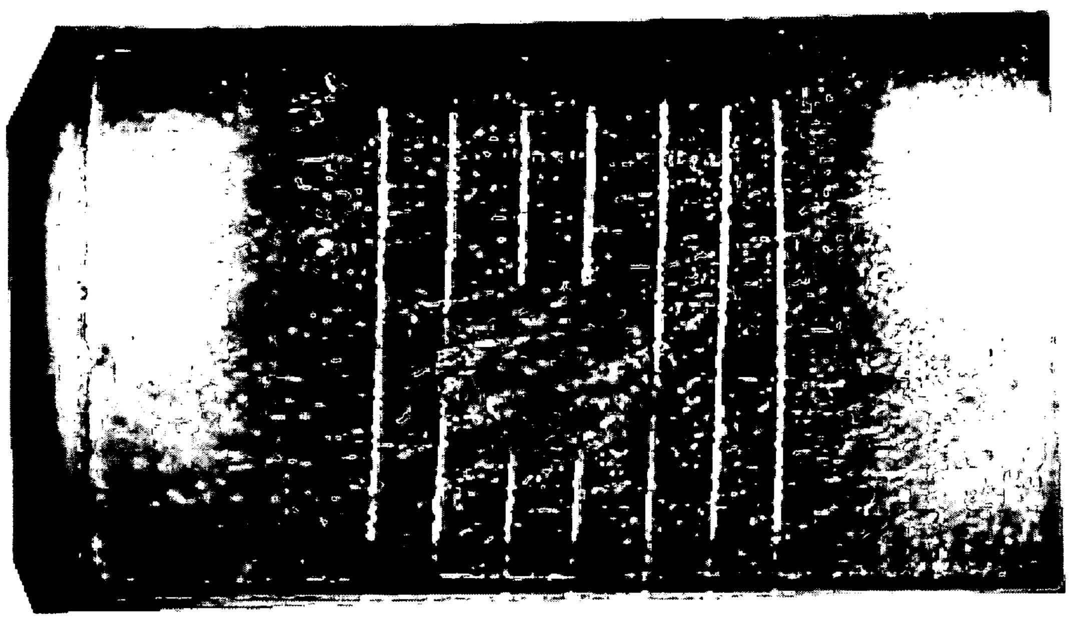
FIG. 17 is a top view of a chip inductor.
Figure 18:
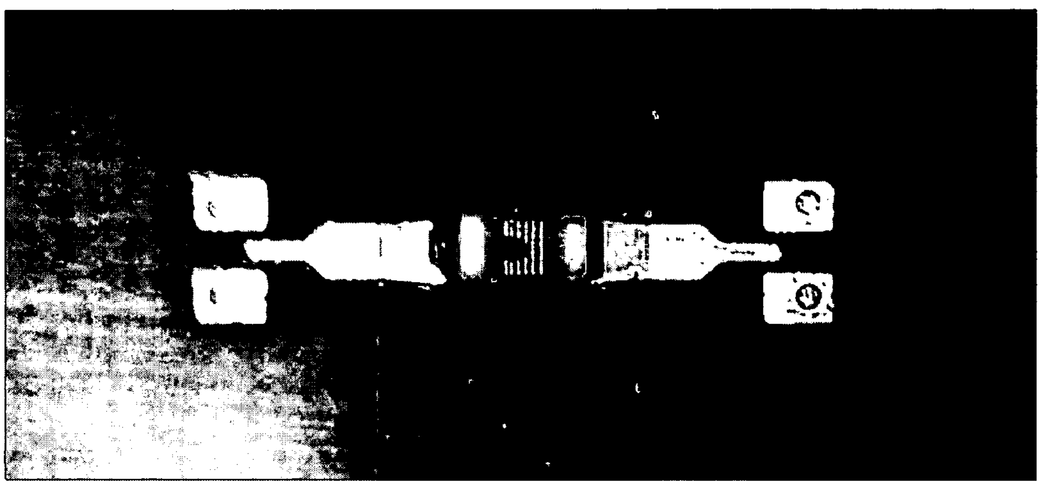
FIG. 18 is a top view of a chip inductor mounted upon a microstrip substrate.

The global model of the present invention can be applied to virtually any micro-strip mounted components. In addition to the global model as it pertains to ceramic multi-layer capacitors described above, in an alternate embodiment of the present invention, the global model can be applied to both chip inductors and chip resistors. FIGS. 17 and 18 illustrate a typical microstrip-mounted chip inductor. An equivalent circuit model can be constructed for a microstrip-mounted chip inductor, as can be seen in FIG. 19.

Figure 19:
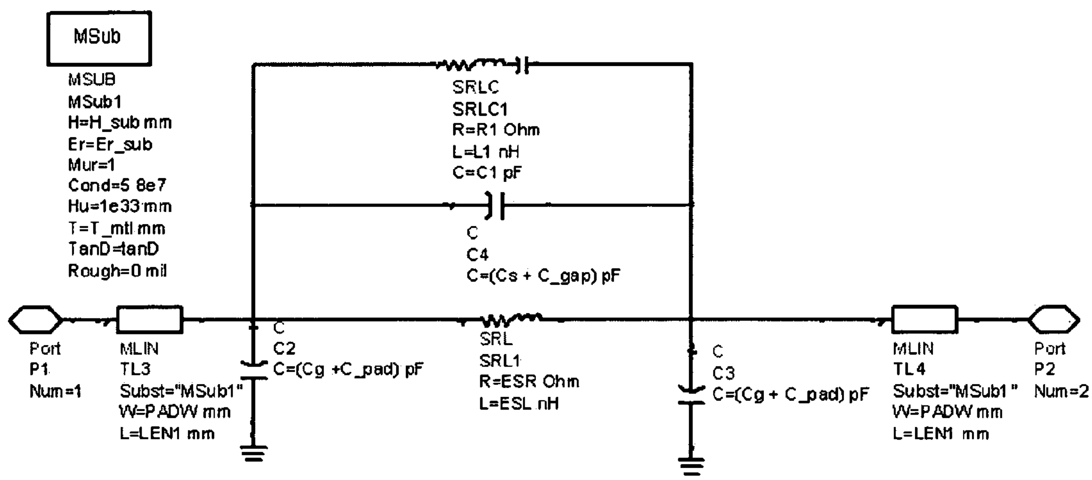
FIG. 19 illustrates the substrate dependent equivalent circuit model for a chip inductor mounted on a microstrip substrate.

The schematic in FIG. 19 represents a typical equivalent circuit model for a chip inductor mounted on a microstrip substrate. The substrate parameters are defined in the MSUB block.

In FIG. 19, Port P1 and Port P2 identify connection points within the simulation software program. MLIN TL3 and MLIN TL4 represent models for sections of microstrip transmission lines that are used to partially represent the effects of the "pad stack" (metal pads) onto which the inductor is attached when being mounted to the substrate. The microstrip transmission line models are standard models found in most simulation tools. The pad stacks are generally larger than the bond pad section of the chip inductor itself, and these MLIN sections represent the portion of the pad stack that is not covered when the part is mounted.

The capacitors to ground, C2 and C3, are comprised of two capacitances, Cg and C_pad. C_pad represents the capacitance between the portions of the pad stack onto which the inductor is physically mounted. Cg represents the capacitance between the body of the chip inductor coil and the ground plane of the interconnect transmission line.

The lower branch in the center of the schematic of FIG. 19 contains ESR, the effective series resistance of the inductor coil and ESL, the effective series inductance of the inductor coil. The middle branch in the center of the schematic contains Cs, a parallel capacitance comprised of Cs and C_gap. C_gap represents capacitance that occurs between the pad stacks on either side of the inductor, onto which the inductor is mounted. Cs represents the capacitance that exists between the turns of the coil inductor itself. Finally, the top branch in the schematic of FIG. 19 contains R1, C1 and L1, a resistor, capacitor and inductor, respectively. The elements in this branch are used to represent the first higher-order resonance that the chip inductor will exhibit. The combination of ESL and Cs+C_gap results in the fundamental, or lowest order, resonance of the chip inductor. Additional branches can be added, e.g. R2, C2, and L2, to represent additional higher-order resonance effects.

The following variables are fixed value parameters that are used in the global model for chip inductors:L=7.5 STAT{gauss+/−5%}

*U*0=0.075

*U*1=2.793*e*−7*U*2=0.722

*PADW*=0.508

*LEN*1=0.1

L is the nominal inductance of the chip inductor (in this example 7.5 nH). It is used to calculate ESL in the equations below. U0, U1 and U2 are used to calculate the frequency-dependent effective series resistance (ESR) in the equations shown below. PADW is the width of the pad stack on either side of the chip inductor. LEN1 is the length of the pad stack that is not covered by the chip inductor, and is used in the definition of the MLIN objects discussed above.

The following variables are optimizable parameters that are determined during the global model extraction process for chip inductors:W_eff=0.518158 opt {0.2 to 1}

*L_eff*=1.26433 opt {0.2 to 2}

*Kg_a*=0.98275 opt {0.1 to 2}

*Kg_b*=4.40481 opt {−5 to 3}

*Cs*=0.00921001 opt {0 to 1}

*C*1=0.00601287 opt {0.004 to 0.008}

*L*1*a*=18.5642 opt {15 to 30}

*L*1*b*=−0.01889 opt {−0.1 to 0.1}

*R*1=145.132 opt {90 to 160}

W_eff represents the effective body width of the chip inductor. L_eff is the effective body length of the chip inductor. Kg_a and Kg_b are fitting parameters used in the equation that defines the effective series inductance (ESL). Cs is the capacitance between the turns of the chip inductor coil. C1 is the capacitance found in the branch representing the first higher-order resonance effects. L1*a* and L1*b* are parameters used in the equation to calculate L1, the inductance in the branch that is used to represent the first higher-order resonance. R1 is the resistance found in the branch representing the first higher-order resonance effects.

The equations listed below are used to calculate values of certain parameters in the global equivalent circuit modeling system of the present invention as applied to chip inductors:

ESR=U1*(freq)ΛU2+U0

ESL=(L)*(Kg_a (Kg_b)*In(W_eff/H_sub+T_mtl)))

L1=(L1a L1b*In(W_eff/(H_sub+T_mtl)))

Ere_sub=(Er_sub+1)/2+(Er_sub 1)2*1 (H_sub+T_mtl)/W_eff)

Cg=ere_sub/(3e11*60*In(8*(H_sub+T_mtl) /W_eff/ 4/(H_sub+T_mtl)))*L_eff/2*1e12

ESR represents the effective series resistance, represented using a frequency-dependent expression. ESL is the effective series inductance, expressed as a function of the effective chip inductor body width, the substrate height, and the thickness of the metal trace upon which the inductor is mounted. The thickness of the metal trace is essentially the pad stack metal height.

L1 is the inductance used in the branch representing the first higher-order resonance effects, and is also expressed as a function of the effective chip inductor body width, the substrate height, and the thickness of the metal trace upon which the inductor is mounted. Ere_sub represents the effective dielectric constant of the substrate, assuming the chip inductor coil is treated as a pseudomicrostrip line of width W_eff. In this expression, Er_sub is the relative dielectric constant of the substrate material. Cg is the capacitance between the chip inductor body and the ground beneath the substrate. It is a function of the effective dielectric constant, the substrate height, the metal thickness, the effective body width of the chip inductor and the effective body length of the chip inductor.

The equations listed below are related to the capacitance associated with the pad stacks upon which the chip inductor is mounted.

ti $GAP$=0.601 me=1.565/)$PADW$/($H$_sub+$T$_mtl))**0.16-1 ke=1.97 0.03/($PADW$/($H$_sub+$T$-mtl))

mo=$PADW$/$H$_sub+$T$_mtl)*(0.619*log($PADW$/($H$_sub+$T$_mtl))-0.3853

$ko$=4.26 1.453*log($PADW$/$H$_sub+$T$_mtl)) 0.3853

$C_e$=($GAP$/$PADW$)**me*2.7183**ke*$PADW$*0.001

$C_{even}$=($Er$_sub/9.6)**0.9*

$C_eC\_pad=C_{even}/2C_o$=($GAP$/$PADW$)**mo*2.7183**$ko$*$PADW$*0.001

$C_{0dd}$=($Er$_sub/9.6)**0.8*$Co$ $C_{\_gap}$=($C_{0dd}C$_pad)/2

GAP represents the spacing between the pad stacks. C_pad represents the capacitance between the pad stacks and the ground plane beneath the substrate. C_gap represents the capacitance between the pad stacks on either side of the chip inductor.

Figure 20:
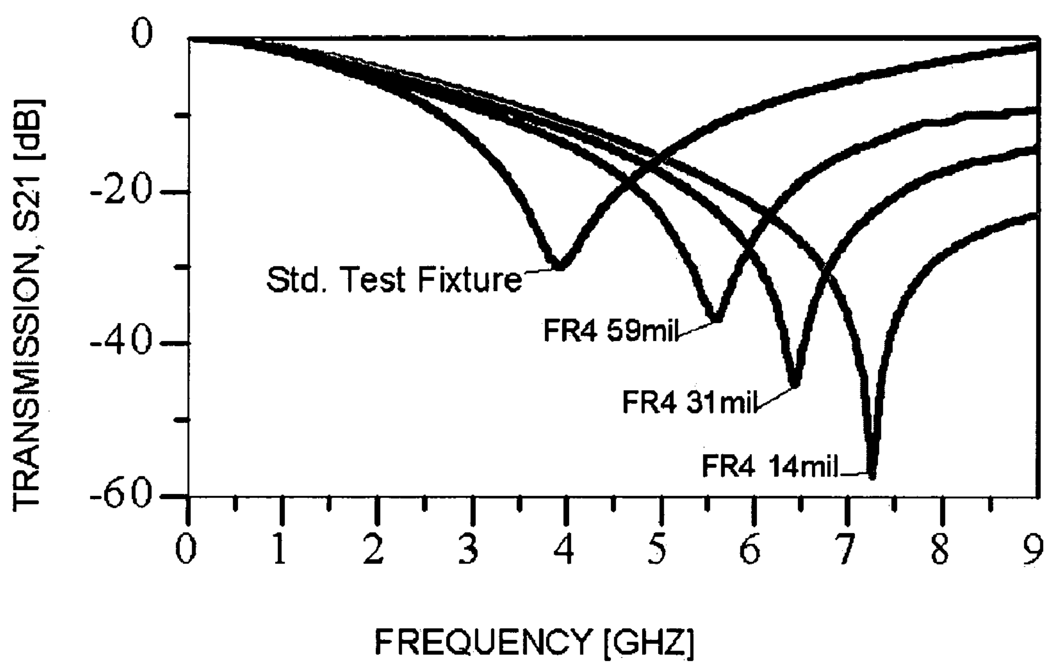
FIG. 20 is a graphical representation of the $S_{21}$ transmission response of a series-mounted, 10 nH chip inductor mounted on three different size (14, 31 and 59 mil-thick) microstrip substrates and a standard text fixture without incorporation of the substrate dependent model of the present invention, illustrating substrate dependency.

Referring now to FIG. 20, the graphical representation of the response of a typical chip inductor for three different substrate sizes and a standard, commercially available text fixture can be seen.

The relationship between substrate thickness and the response of the chip inductor is evident in this illustration. Here, the $S_{21}$ transmission response of a series-mounted, 10 nH chip inductor can be seen to vary drastically as the substrate size varies from 14 mils, to 31 mils, up to 59 mils. This illustration emphasizes the important role that a substrate-dependent equivalent circuit model plays in predicting component response parameters.

Figure 21:
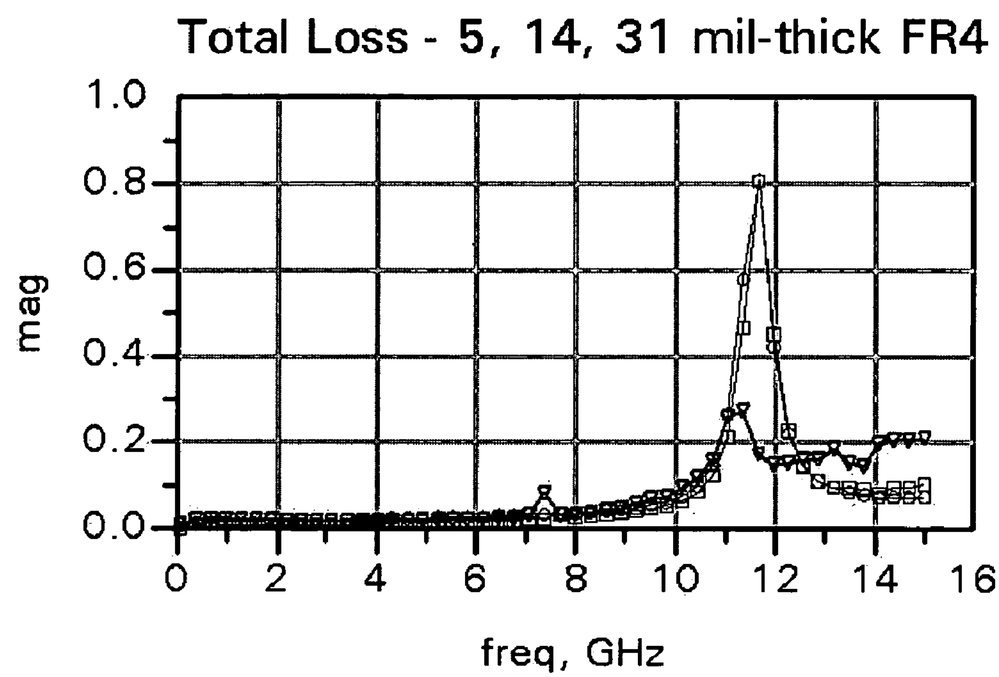
FIG. 21 is a graphical representation of the total radiation loss for a 15 nH chip inductor mounted on three different size (5, 14 and 31 mil thick) microstrip substrates.

FIG. 21 represents an illustration of the radiation loss of a 15 nH chip inductor mounted upon three different substrate sizes. In this figure, a 5 mil-thick FR4 microstrip substrate is represented by circles, a 14 mil-thick substrate is represented by squares, and a 31 mil-thick substrate is represented by triangles. Once again, this figure illustrates the motive behind an equivalent circuit model that takes into account substrate thicknesses.

Figure 22:
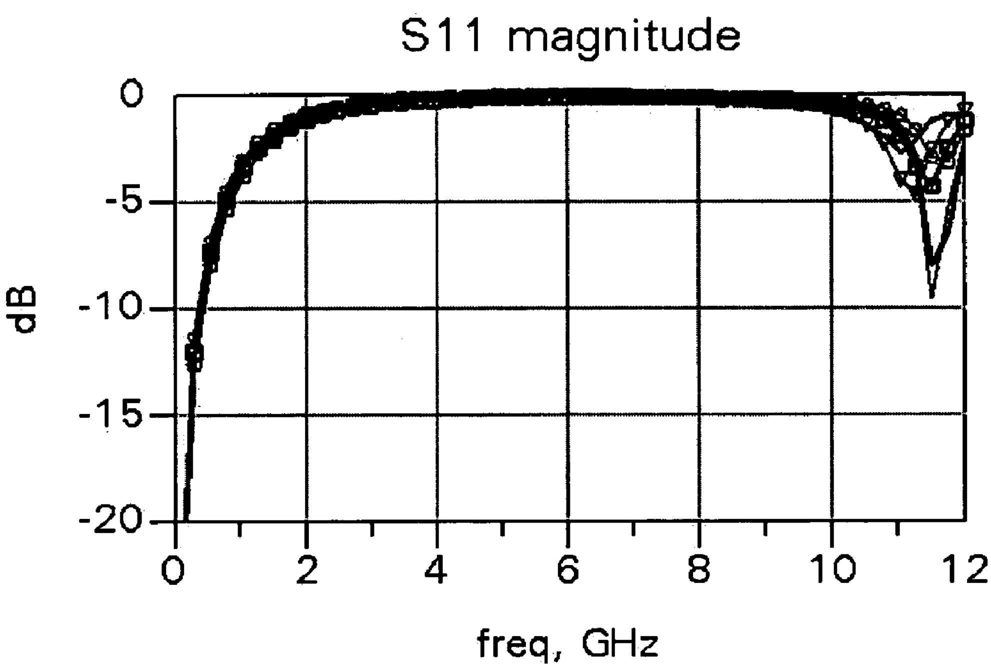
FIG. 22 graphically illustrates a comparison of measured data and model predictions for the $S_{11}$ reflection response of a 15 nH chip inductor mounted on three different size (5, 14 and 31 mil thick) substrates.

FIG. 22 is a graphical comparison between the measured data and the $S_{11}$ response predictions for a 15 nH chip inductor mounted upon three different-sized substrates using the present invention. The solid lines represent the measured data and the markers represent the reflection response. Once again, a 5 mil-thick FR4 microstrip substrate is represented by circles, a 14 mil-thick substrate is represented by squares, and a 31 mil-thick substrate is represented by triangles.

Figure 23:
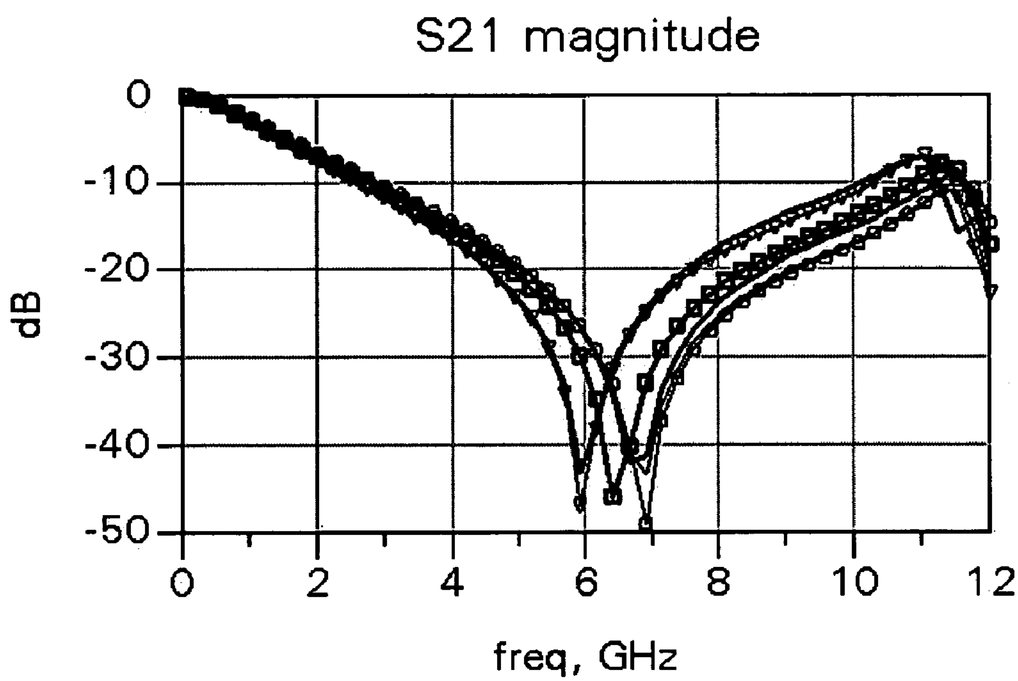
FIG. 23 graphically illustrates a comparison of measured data and model predictions for the $S_{21}$ reflection response of a 15 nH chip inductor mounted on three different size (5, 14 and 31 mil thick) substrates.

FIG. 23 is a graphical comparison between the measured data and the $S_{21}$ response predictions for a 15 nH chip inductor mounted upon three different-sized substrates using the present invention.

Figure 24:
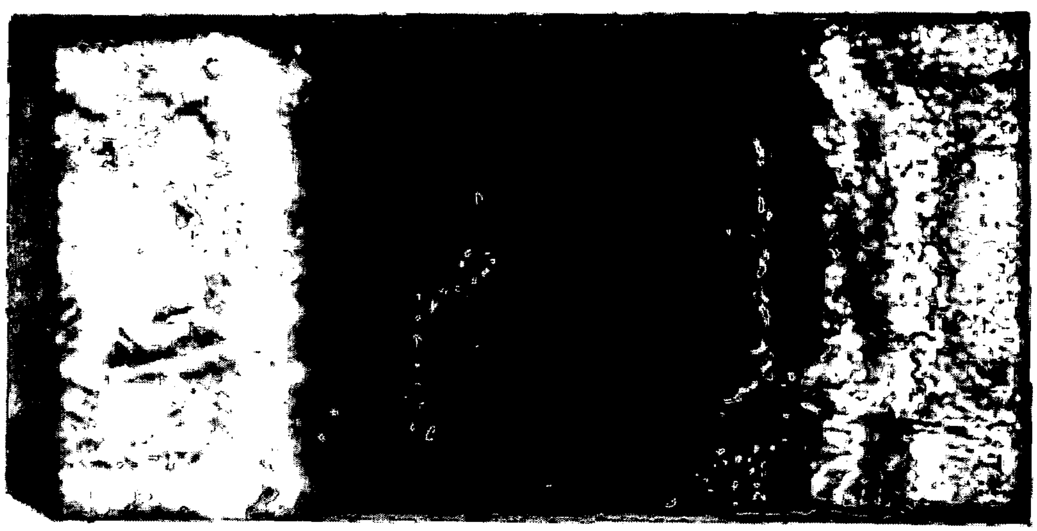
FIG. 24 is a top view of a chip resistor.
Figure 25:
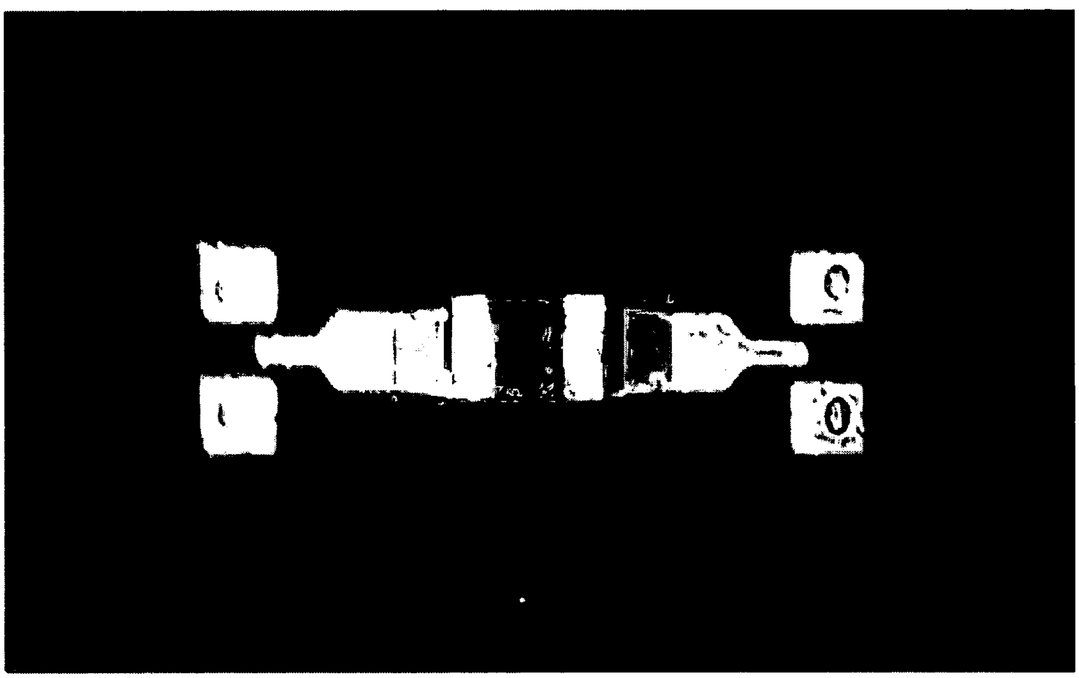
FIG. 25 is a top view of a chip resistor mounted on a microstrip substrate.

The global equivalent circuit model of the present invention can also be applied to microstrip-mounted chip inductors. Again, the examples given both below and above are merely illustrative examples of components for which a global model using the present invention can be constructed. FIGS. 24 and 25 show a typical chip resistor mounted upon a microstrip substrate.

Figure 26:
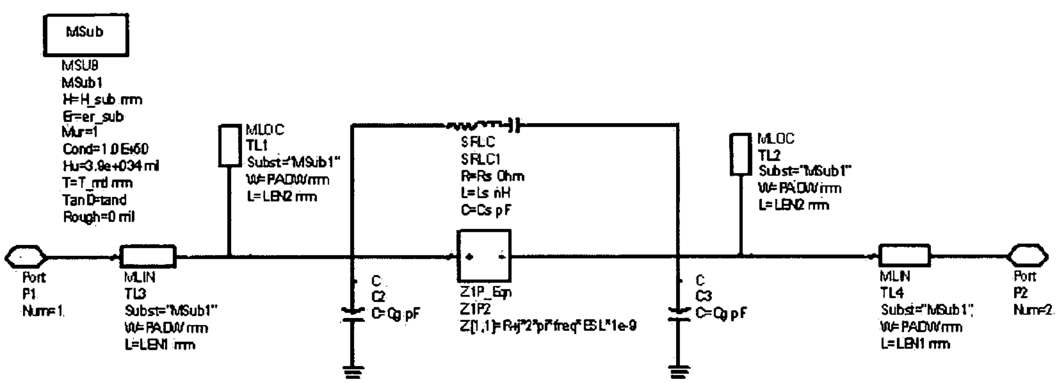
FIG. 26 illustrates the substrate dependent equivalent circuit model for a chip resistor mounted on a microstrip substrate.

FIG. 26 represents a typical equivalent circuit model for a chip resistor mounted on a microstrip substrate. The substrate parameters are defined in the MSUB block. Port P1 and Port P2 identify connection points within the simulation software program. The objects MLIN TL1-TL4 are models for sections of microstrip transmission lines that are used to represent the effects of the "pad stack" (metal pads) onto which the resistor is attached when being mounted to the substrate. The microstrip transmission line models are standard models found in most simulation tools. The pad stacks are generally larger than the bond pad section of the chip resistor itself.

The capacitors to ground, C2 and C3, are equated to the capacitance Cg. Cg represents the net capacitance between the body of the chip resistor and the ground plane beneath the microstrip substrate. The lower branch in the center of the schematic contains R and ESL, the nominal resistance of the chip resistor and the effective series inductance of the chip resistor, respectively. The top branch in the schematic contains Rs, Cs and Ls, a resistor, capacitor and inductor, respectively. The elements in this branch are used to represent higher-order resonance effects that the chip resistor may exhibit. Additional branches can be added to represent additional higher-order resonance effects, as necessary to emulate experimental data.

The variables listed in the figure below are parameters used in the model that are related to the physical geometry of the chip resistor:

$L\_res$=1.016$H_res$=0.3555

$LEN$1=0.0889

$LEN$2=0.1651PADW=0.556

L_res represents the physical length of the chip resistor. H_res represents the effective height of the chip resistor above the top surface of the substrate to which it is mounted (effectively the physical body height of the chip resistor). LEN1 is the length of the pad stack that is not covered by the chip resistor, and is used in the definition of the MLIN objects discussed above. LEN2 is the length of the pad stack that is covered by the chip resistor, and is used in the definition of the MLIN objects discussed above. PADW is the width of the pad stack on either side of the chip resistor.

The variables listed below include the nominal resistance of the chip resistor as well as optimizable parameters that are determined during the model extraction process:

$R$=4.7 stat{gauss+/−5%}

$C\_res$=48

$ESL_a$=0.0405193

*ESL_b*=0

*Kg_a*=3.47547

*Kg_b*=7.68025

*Csx*=0.0142556

*Lsx*=0.60787

*Rs*=305

*Wf*=0.175289

Referring to the table above, R represents the nominal resistance of the chip resistor. C_res represents the effective capacitance between the body of the chip resistor and the top surface of the substrate to which it is mounted. ESL_a and ESL_b are fitting parameters used in the equation that defines the effective series inductance (ESL). Kg_a and Kg_b are fitting parameters used in the equation that defines the effective series inductance (ESL) and the inductor and capacitor in the upper branch of the equivalent circuit (Cs and Ls). Csx represents a fitting parameter used in the equation used to define the capacitor in the upper branch of the equivalent circuit (Cs). Lsx represents a fitting parameter used in the equation used to define the inductor in the upper branch of the equivalent circuit (Ls). Rs represents the resistance found in the branch representing the first higher-order resonance effects. Wf is used to represent the effective width of the chip resistor.

The equations listed in below are used to calculate values of certain parameters in the model:

*ESL*=(*ESL_a*+*ESL_b**freq*1e−9)*(*Kg_a*  *Kg_b**In(*Wf*/(*H*_sub+*H_res*+*T*_mtl)))

*ere*_sub=(*er*_sub+1)/2+(*er*_sub−1)/2*1/sqrt(1+12**H*_sub/*Wf*)

*Ctl*_sub=*ere*_sub*(*Wf*/*H*_sub+1.393+0.667*In(*Wf*/*H*_sub+1.444))L_res0.00442097

*Cs*=*Csx**(*Kg_a*−*Kg_b**In(*Wf*/(*H*_sub+*H_res*+*T*_mtl)))

*Ls*=*Lsx**(*Kg_a*−*Kg_b**In(*Wf*/(*H*_sub+*H*_res+T_mtl)))

ESL represents the effective series inductance, expressed as a function of the effective chip resistor body width, the substrate height, and the thickness of the metal trace upon which the resistor is mounted (essentially the pad stack metal height). Cg is the net effective capacitance between the chip resistor body and the ground plane beneath the substrate. It is a function of C_res (defined above) and the capacitance between the top of the substrate and the ground plane beneath the substrate, Ctl_sub. Ere_sub is the effective dielectric constant of the substrate, assuming the chip resistor is treated as a pseudo-microstrip line of width Wf. In this expression, er_sub is the relative dielectric constant of the substrate material.

Ctl_sub represents the capacitance between the top of the substrate to which the chip resistor is mounted and the ground plane beneath the substrate. It is a function of the effective dielectric constant, the substrate height, the metal thickness, the effective body width of the chip resistor and the effective body length of the chip resistor. Cs represents the capacitance used in the branch representing the first higher-order resonance effects, and is also expressed as a function of the effective chip resistor body width, the substrate height, the effective height at which the chip resistor is mounted above the top of the substrate (effectively the physical body height of the chip resistor), and the thickness of the metal trace upon which the chip resistor is mounted. Ls represents the inductance used in the branch representing the first higher-order resonance effects, and is also expressed as a function of the effective chip resistor body width, the substrate height, the effective height at which the chip resistor is mounted above the top of the substrate (effectively the physical body height of the chip resistor), and the thickness of the metal trace upon which the chip resistor is mounted.

Figure 27:
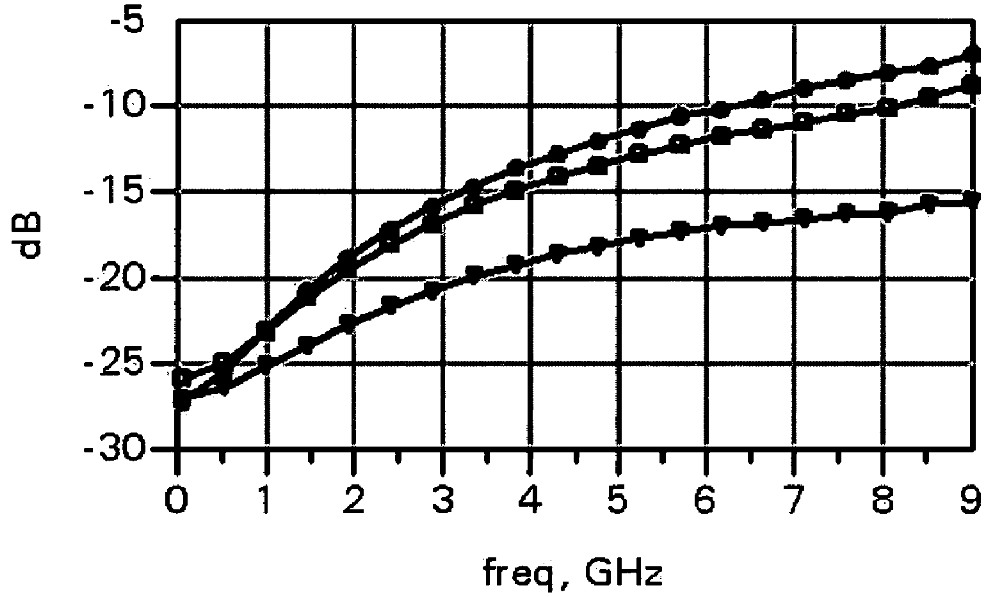
FIG. 27 is a graphical representation of the measured $S_{11}$ reflection response of a series-mounted, 4.7 Ohm chip resistor on three different size (14, 31 and 59 mil-thick) microstrip substrates.

FIG. 27 compares the measured reflection response ($S_{11}$) of a series-mounted, 4.7 Ohm chip resistor for three different FR4-type substrates; 14 mils is represented by triangles, 31 mils is represented by squares and 59 mils-thick is represented by circles.

Figure 28:
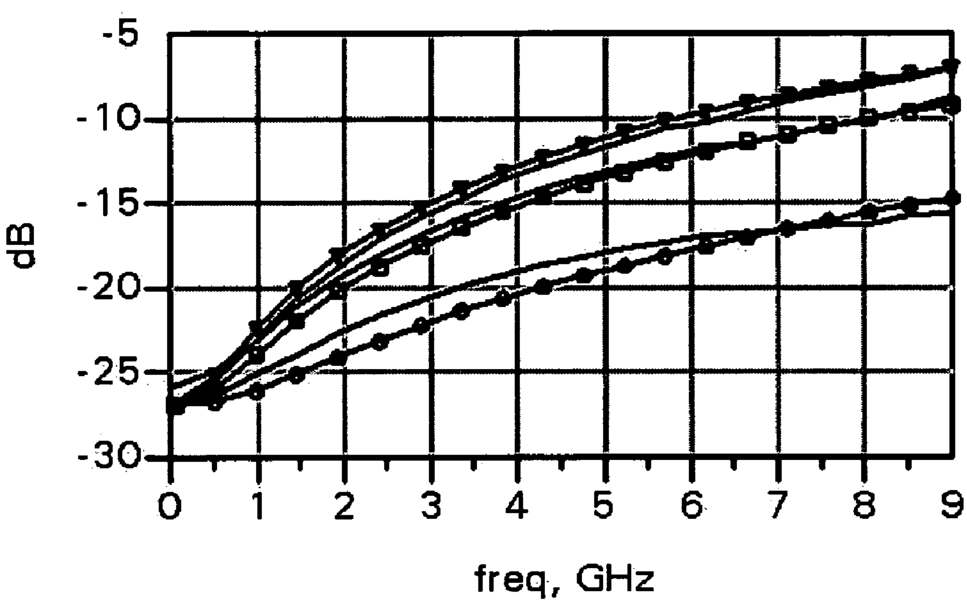
FIG. 28 graphically illustrates a comparison of measured data and model predictions for the $S_{11}$ reflection response of a 4.7 Ohm chip inductor mounted on three different size (14, 31 and 59 mil thick) microstrip substrates.

FIG. 28 compares measured data (solid lines) and model predictions (markers) for the ($S_{11}$) reflection response of a 4.7 Ohm chip resistor mounted on 14 (represented by circles), 31 (represented by squares) and 59 (represented by triangles) mil-thick FR4 microstrip substrates.

Figure 29:
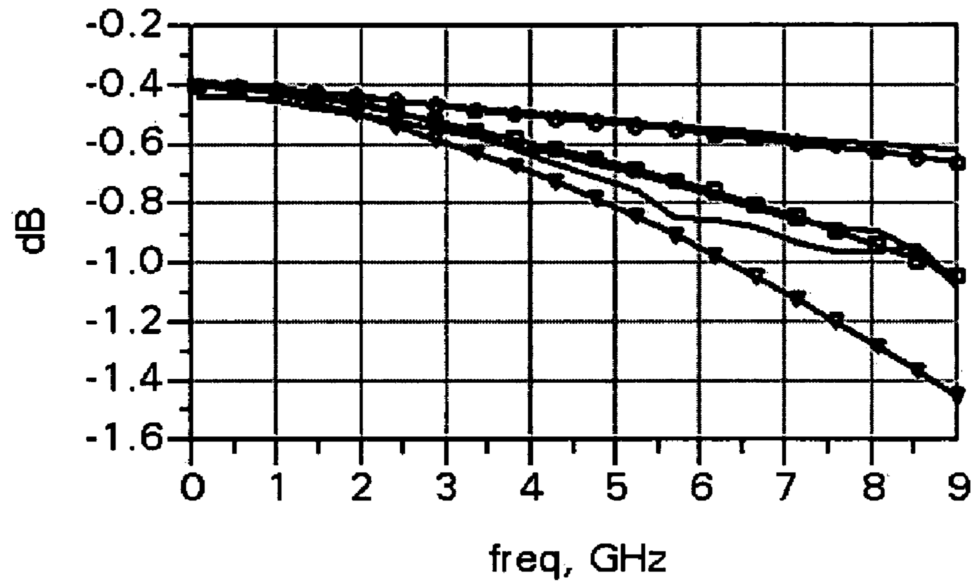
FIG. 29 graphically illustrates a comparison of measured data and model predictions for the $S_{21}$ transmission response of a 4.7 Ohm chip resistor mounted on three different size (14, 31 and 59 mil-thick) microstrip substrates.

FIG. 29 compares measured data (solid lines) and model predictions (markers) for the ($S_{21}$) transmission of a 4.7 Ohm chip resistor mounted on 14 (represented by circles), 31 (represented by squares) and 59 (represented by triangles) thick FR4 microstrip substrates.

In summary, the substrate-dependent model of the present invention 10 can be applied to CMCs, air coil inductors, chip inductors, and chip resistors as well as virtually any other substrate mounted circuit components. Critical parameters such as $C_g$ and ESL are evaluated using closed-form equations with explicit dependence on the substrate properties. Further, since the model is based on an approximate physical representation of the component, parameter values may vary in a reasonable manner with component value. This uniform variation in the element values enables a global modeling-technique to predict the intermediate values with a high degree of accuracy. Therefore, a complete high-frequency behavior of a substrate mounted component can be described using the model of the present invention, which accounts for high order resonances.

It will be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween. Now that the invention has been described,

The invention claimed is:

1. A method for generating an equivalent circuit model to determine the behavior and frequency performance of a substrate mounted electrical circuit component mounted upon a given substrate, the equivalent circuit model incorporating substrate-dependent parameters, the method comprising the steps of:

selecting a substrate mounted electrical circuit component from a group consisting of a single-layer capacitor, a resistor, a chip inductor, an air-coil inductor, a ceramic chip inductor, a ferrite bead, a plastic packaged diode, a plastic packaged transistor, a plastic packaged switch, a beam-lead diode, a coaxial ceramic surface mount resonator, a filter, a coupler and a transformer for which an equivalent circuit model is desired;

determining input parameters of the equivalent circuit model, wherein some of which are dependent upon characteristics of the substrate upon which the electrical circuit component is mounted, for the selected electrical circuit component;

representing the selected electrical circuit component mounted upon the substrate as an equivalent electrical circuit;

formulating mathematical expressions based upon the input parameters; and creating a unique equivalent circuit model for the selected electrical circuit component mounted upon the given substrate, the unique equivalent circuit model representing the mounting of the selected component upon the given substrate wherein the equivalent circuit model provides the behavior and frequency performance predictions of the selected electrical circuit component based upon the given substrate characteristics.

2. The method of claim 1 wherein the step of determining input parameters of the equivalent circuit model comprises the steps of measuring substrate geometric properties and defining equation variables.

3. The method of claim 1 further comprising the step of expanding the unique equivalent circuit model over a plurality of different component values wherein the equivalent circuit model applies to a predetermined range of values for the component thereby creating a global equivalent circuit model for accurately predicting the behavior of a range of component values.

4. The method of claim 1 further comprising the step of incorporating the equivalent circuit model into a circuit simulation tool.

5. The method of claim 1 further comprising the step of optimizing a plurality of unique equivalent circuit models, each of the plurality of unique equivalent circuit models corresponding to a unique element in a circuit schematic.

6. A method for generating an equivalent circuit model to determine the behavior and frequency performance of a substrate mounted chip inductor mounted upon a given substrate, the chip inductor comprising a plurality of coil turns in a surface-mounted package, the method comprising the steps of:

determining input parameters of the equivalent circuit model, wherein some of which are dependent upon characteristics of the substrate upon which the chip inductor is mounted;

representing the chip inductor mounted upon the substrate as an equivalent electrical circuit;

calculating substrate dependence inductance terms based upon the input parameters; and creating a unique equivalent circuit model for the chip inductor upon the given substrate, the unique equivalent circuit model representing the mounting of the chip inductor upon the given substrate wherein the equivalent circuit model provides behavior and performance predictions of the chip inductor based upon the given substrate characteristics.

7. The method of claim 6 wherein the step of calculating substrate dependent inductance terns based upon the input parameters further comprises the step of:

representing the inductance terms as a function of an effective chip inductor body width, a substrate thickness and a thickness of a metal trace upon which the chip inductor is mounted, wherein the step of representing the inductance terms uses the following equation:

$$ESL(H,W,T)=(L\_nom)*(Kg\_a-Kg\_b)*(\ln(W/(H+t)))$$

wherein:

ESL represents an effective series inductance of the chip inductor as mounted upon the substrate;

H represents the thickness of the substrate;

W represents the effective chip inductor body width;

t represents the thickness of the metal trace to which the chip inductor is mounted upon the substrate;

L_nom represents a nominal inductance of the chip inductor; and

Kg_a and Kg_b represent filling coefficients.

8. The method of claim 6 wherein the equivalent circuit model is applicable at a fundamental resonant frequency of the chip inductor.

9. The method of claim 6 wherein the equivalent circuit model is applicable at or beyond a higher order resonance frequency of the chip inductor.

10. A method for generating an equivalent circuit model to determine the behavior and frequency performance of a substrate mourned chip resistor mounted upon a given substrate, the method comprising the steps of:

determining input parameters of the equivalent circuit model, wherein some of which are dependent upon characteristics of the substrate upon which the chip resistor is mounted;

representing the chip resistor mounted upon the substrate as an equivalent electrical circuit;

calculating substrate dependence inductance terms based upon the input parameters; and creating a unique equivalent circuit model for the chip resistor upon the given substrate, the unique equivalent circuit model representing the mounting of the chip resistor upon the given substrate wherein the equivalent circuit model provides behavior and performance predictions of the chip resistor based upon the given substrate characteristics.

11. The method of claim 10 wherein the step of calculating substrate dependence inductance terms based upon the input parameters further comprises the step of:

representing the inductance terms as a function of an effective chip resistor body width, a substrate height and a thickness of the metal trace upon which the chip resistor is mounted, wherein the step of representing the inductance terms uses the following equation:

$$ESL(H,W,T)=ESL\_a+ESL\_b*freq*1e-9)*(Kg\_a-Kg\_b*\ \ln(Wf/(H\_sub+H\_res+T\_mtl)))$$

wherein:

ESL represents an effective series inductance of the chip resistor as mounted upon the substrate;

ESL_a, ESL_b, Kg_a and Kg_b are fitting parameters;

Wf represents the effective chip resistor body width;

H_sub represents a thickness of the substrate;

H_res represents the effective height of the chip resistor above a top surface of the substrate to which it is mounted; and T represents the thickness of the metal trace to which the chip resistor is mounted upon the substrate.

12. The method of claim 10 wherein the equivalent circuit model is applicable at a fundamental resonant frequency of the chip resistor.

13. The method of claim 10 wherein the equivalent circuit model is applicable at or beyond a higher order resonance frequency of the chip resistor.

14. A computer program stored in a computer readable medium embodying instructions to perform a method for generating an equivalent circuit model to determine the behavior and frequency performance of a substrate mounted electrical circuit component mounted upon a given substrate, the equivalent circuit model incorporating substrate-dependent parameters, the method comprising the steps of:

selecting an electrical circuit component from a group consisting of a single-layer capacitor, a resistor, a chip inductor, an air-coil inductor, a ceramic chip inductor, a ferrite bead, a plastic packaged diode, a plastic packaged transistor, a plastic packaged switch, a beam-lead diode, a coaxial ceramic surface mount resonator, a filter, a coupler and a transformer, determining input parameters of the equivalent circuit model, wherein some of which are dependent upon characteristics of the substrate upon which the electrical circuit component is mounted, for the selected electrical circuit component;

representing the electrical circuit component mounted upon the substrate as an equivalent electrical circuit;

formulating mathematical expressions based upon the input parameters; and creating a unique equivalent circuit model for the electrical circuit component mounted upon the given substrate, the unique equivalent circuit model representing the mounting of the electrical circuit component upon the given substrate wherein the equivalent circuit model provides the behavior and frequency performance predictions of the electrical circuit component based upon the given substrate characteristics.

15. A circuit simulation apparatus comprising:

input circuit parameters; and processing means for determining optimal circuit components, wherein the processing means utilize an equivalent circuit modeling system that determines the behavior and frequency performance of circuit components as a function of characteristics of a circuit board substrate upon which each circuit component is mounted, wherein the equivalent circuit modeling system can be expanded over a plurality of different circuit component values wherein the electrical circuit modeling system applies to a predetermined range of values for each of the circuit components thereby creating a global equivalent circuit modeling system for accurately predicting the behavior of a range of circuit component values.

* * * * *

UNITED STATES PATENT AND TRADEMARK OFFICE

CERTIFICATE OF CORRECTION

PATENT NO. : 7,003,744 B2
APPLICATION NO. : 10/249565
DATED : February 21, 2006
INVENTOR(S) : Thomas Weller and John Capwell It is certified that error appears in the above-identified patent and that said Letters Patent is hereby corrected as shown below:

Title page,
Item [75], Inventors, add:
-- Horace Gordon
5769 Antietam Drive
Sarasota, Florida 34231

Balaji Lakshminarayanan
14535 Bruce B. Downs Blvd., #926
Tampa, Florida 33613 --.

Signed and Sealed this

Fourth Day of July, 2006

JON W. DUDAS
*Director of the United States Patent and Trademark Office*